(12) United States Patent
Shinozaki et al.

(10) Patent No.: US 6,770,941 B2
(45) Date of Patent: Aug. 3, 2004

(54) SEMICONDUCTOR DEVICE AND METHOD OF MANUFACTURING A SEMICONDUCTOR DEVICE

(75) Inventors: Masao Shinozaki, Higashimurayama (JP); Takashi Akioka, Akishima (JP); Kinya Mitsumoto, Tamamura (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 10/002,009

(22) Filed: Dec. 5, 2001

(65) Prior Publication Data

US 2002/0074572 A1 Jun. 20, 2002

(30) Foreign Application Priority Data

Dec. 19, 2000 (JP) .......................................... 2000-386088

(51) Int. Cl.⁷ .................... H01L 29/76; H01L 29/94; H03K 19/091; H03K 17/16
(52) U.S. Cl. .................... 257/369; 257/370; 257/377; 326/58; 326/68; 326/81; 326/86; 326/87; 327/391
(58) Field of Search ........................... 438/199, 216, 438/275, 267; 326/57, 56, 58, 81

(56) References Cited

U.S. PATENT DOCUMENTS

| | | | | |
|---|---|---|---|---|
| 5,262,999 A | * | 11/1993 | Etoh et al. ................... 365/203 |
| 5,329,182 A | * | 7/1994 | Yu ............................... 326/126 |
| 5,631,547 A | * | 5/1997 | Fujioka et al. ............... 323/273 |
| 5,952,847 A | * | 9/1999 | Plants et al. .................. 326/58 |
| 6,107,134 A | * | 8/2000 | Lu et al. ...................... 438/239 |
| 6,119,250 A | * | 9/2000 | Nishimura et al. .......... 365/201 |
| 6,166,561 A | * | 12/2000 | Fifield et al. ................ 326/119 |
| 6,392,439 B2 | * | 5/2002 | Tanaka et al. ................ 326/62 |
| 6,414,536 B1 | * | 7/2002 | Chao ........................... 327/540 |
| 6,417,037 B1 | * | 7/2002 | Feng ........................... 438/216 |

* cited by examiner

*Primary Examiner*—Wael M. Fahmy
*Assistant Examiner*—Shrinivas H. Rao
(74) *Attorney, Agent, or Firm*—Miles & Stockbridge P.C.

(57) ABSTRACT

The invention provides a method of producing a semiconductor device conforming to plural supply voltage specifications without increasing the chip size and the production cost, while the device achieves a high-speed performance. The method includes plural processes for forming plural types of MOS transistors supplied with different power supply voltages in correspondence with external power supply voltages, which are comprised of a first process common to the plural types of MOS transistors, a second process following the first process, which is different by each of the plural types of MOS transistors, and a third process following the second process, which is common to the plural types of MOS transistors.

12 Claims, 30 Drawing Sheets

3.3V WITHSTANDING MOS TRANSISTOR 1.5V WITHSTANDING MOS TRANSISTOR 2.5V WITHSTANDING MOS TRANSISTOR 1.5V WITHSTANDING MOS TRANSISTOR

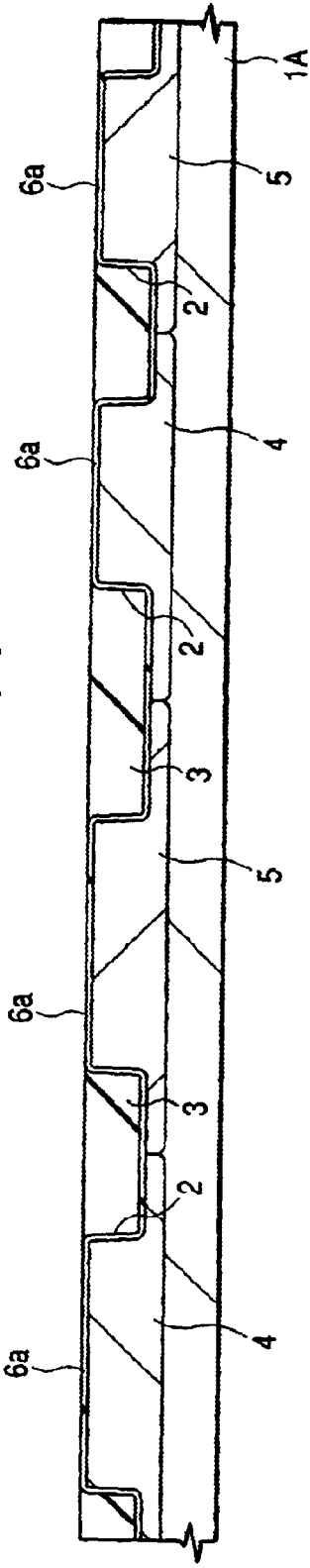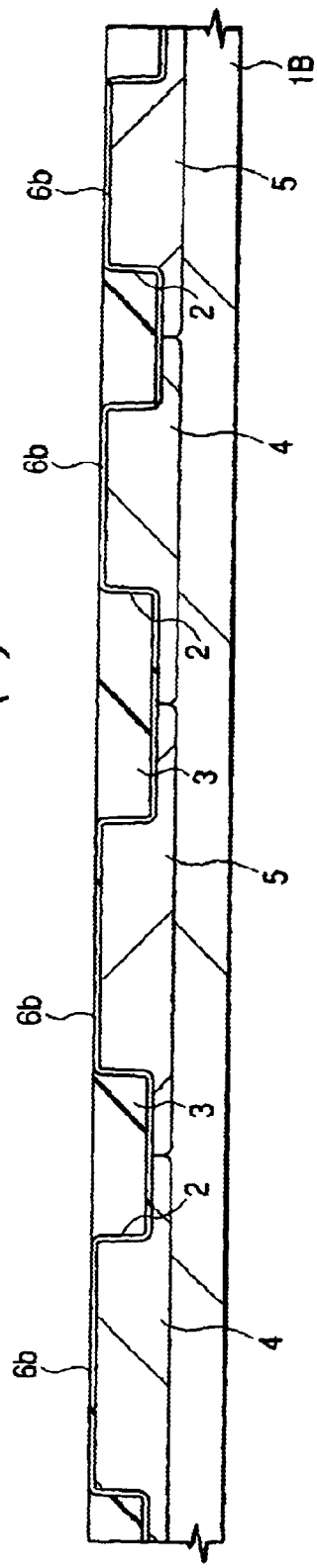
FIG. 11(a)
FIG. 11(b)

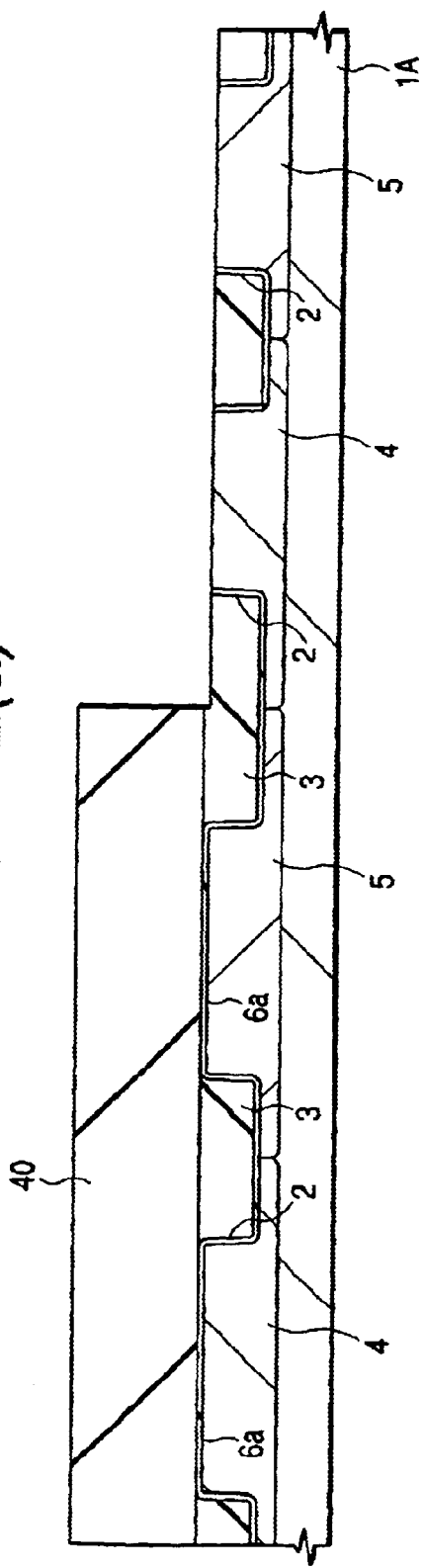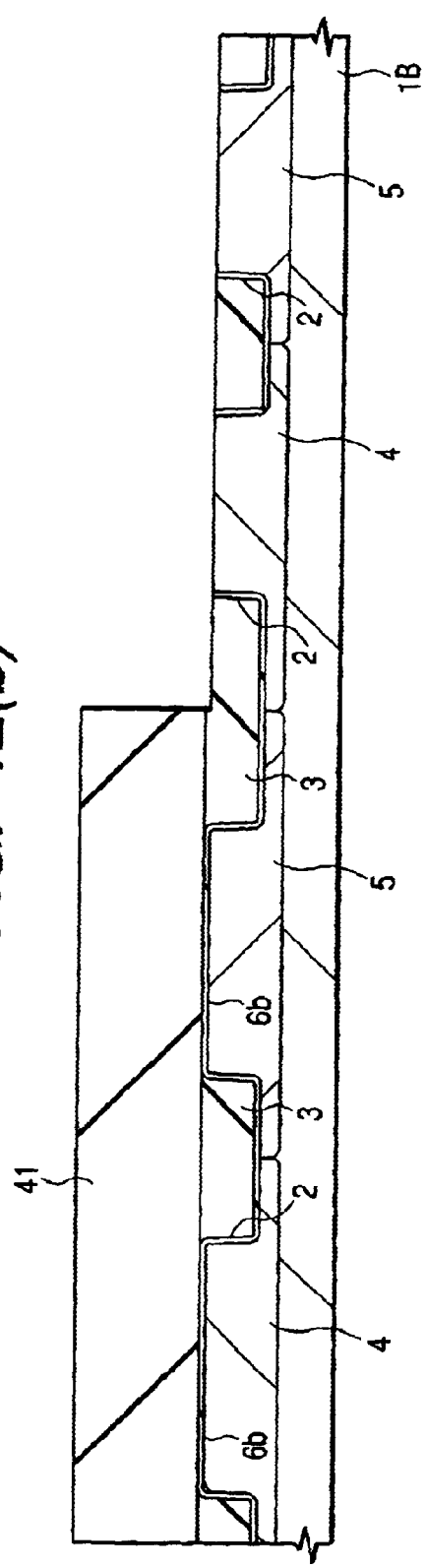

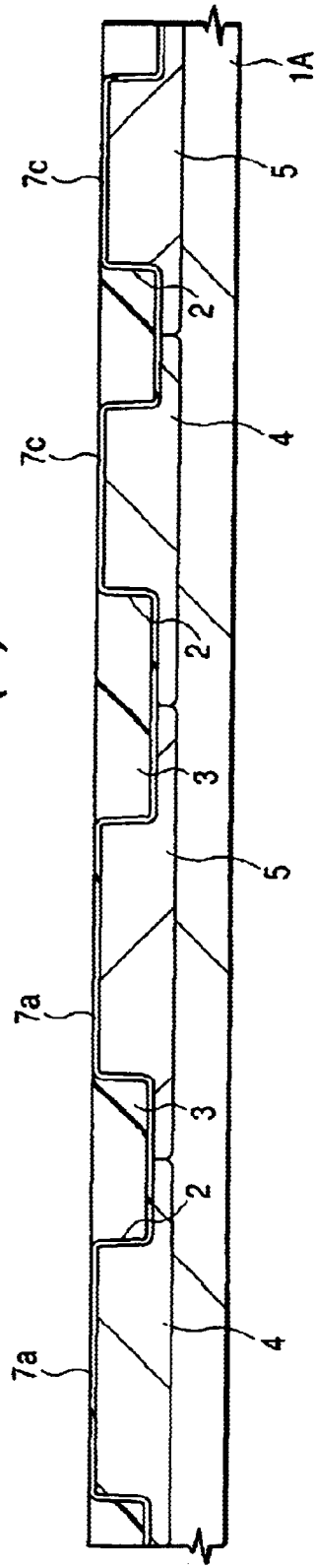
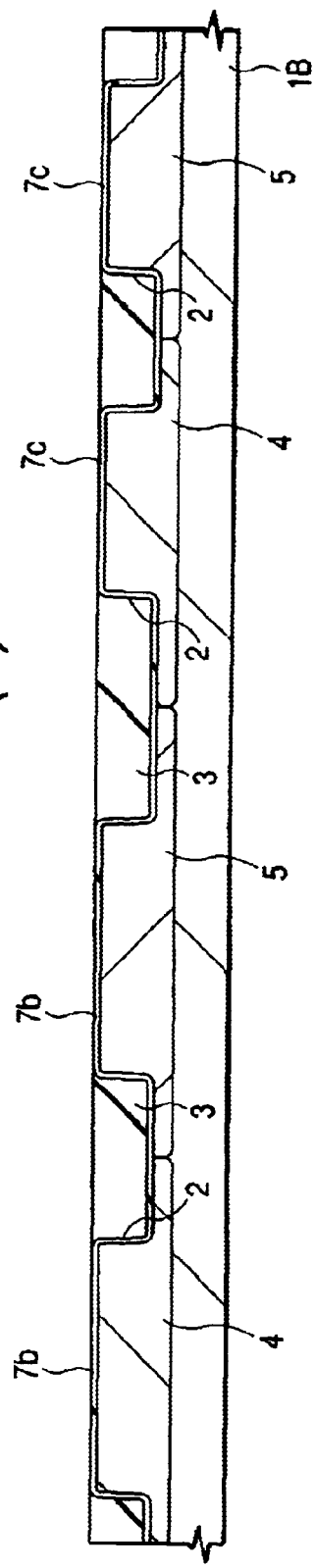
FIG. 13(a)
FIG. 13(b)

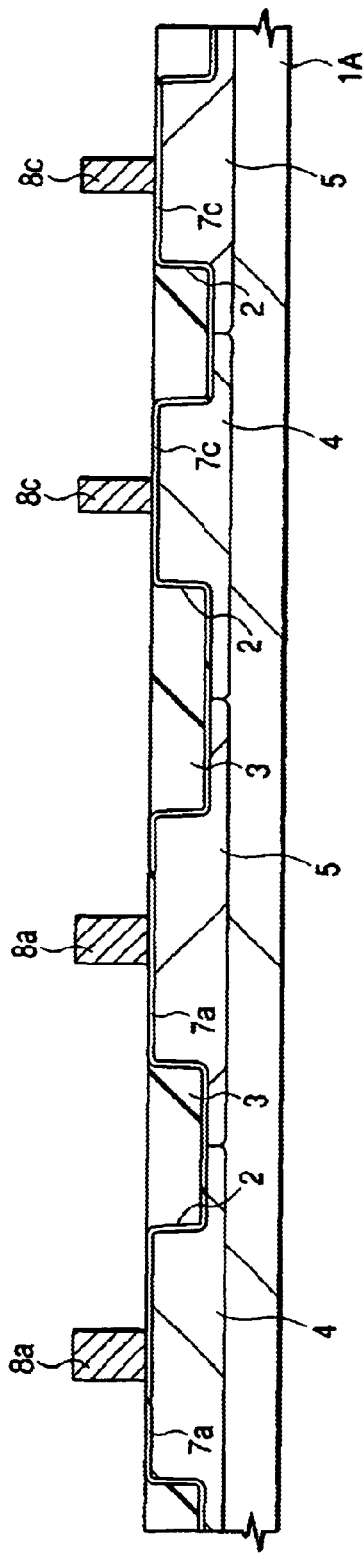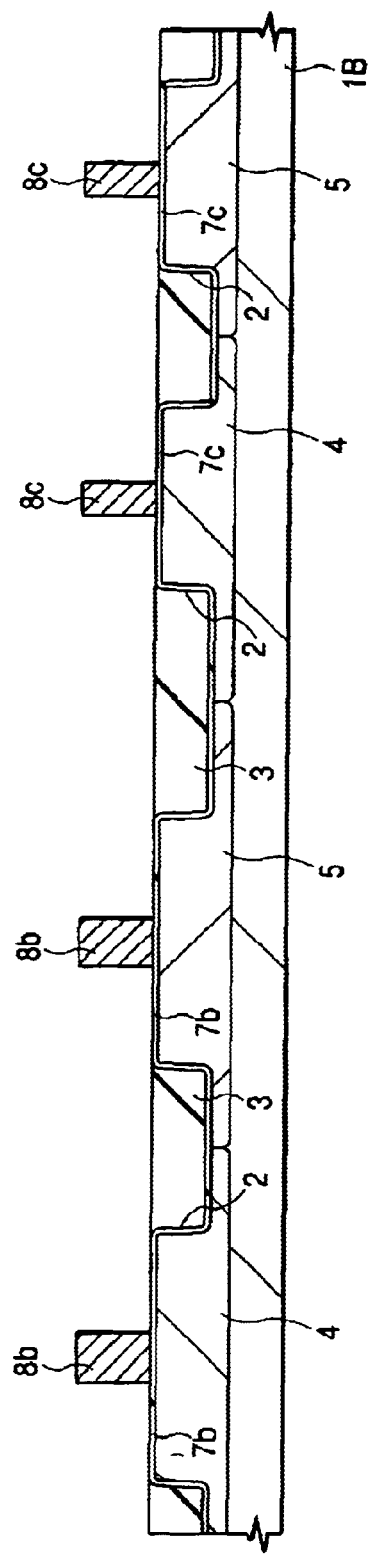
FIG. 14(a)
FIG. 14(b)

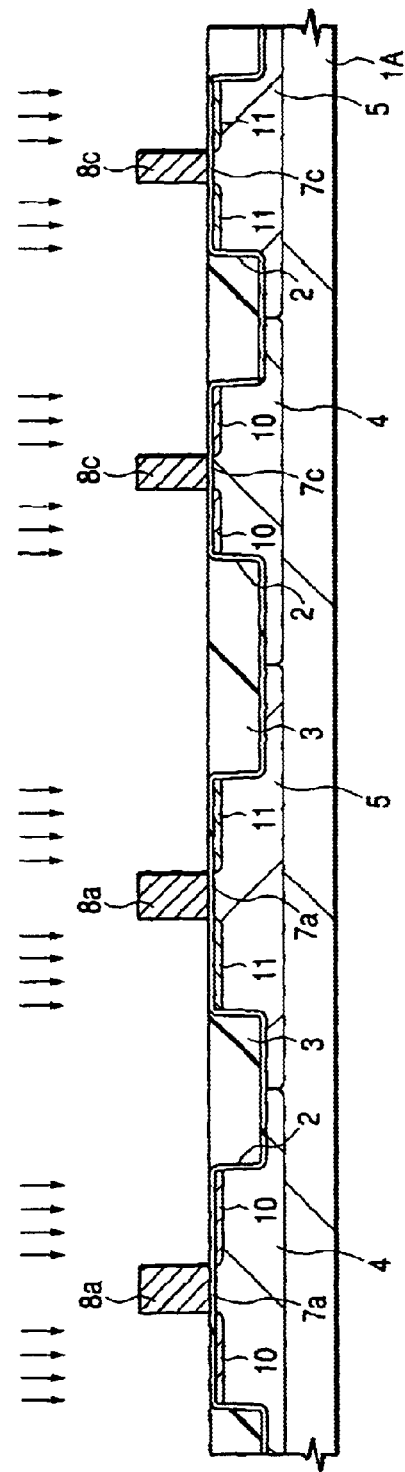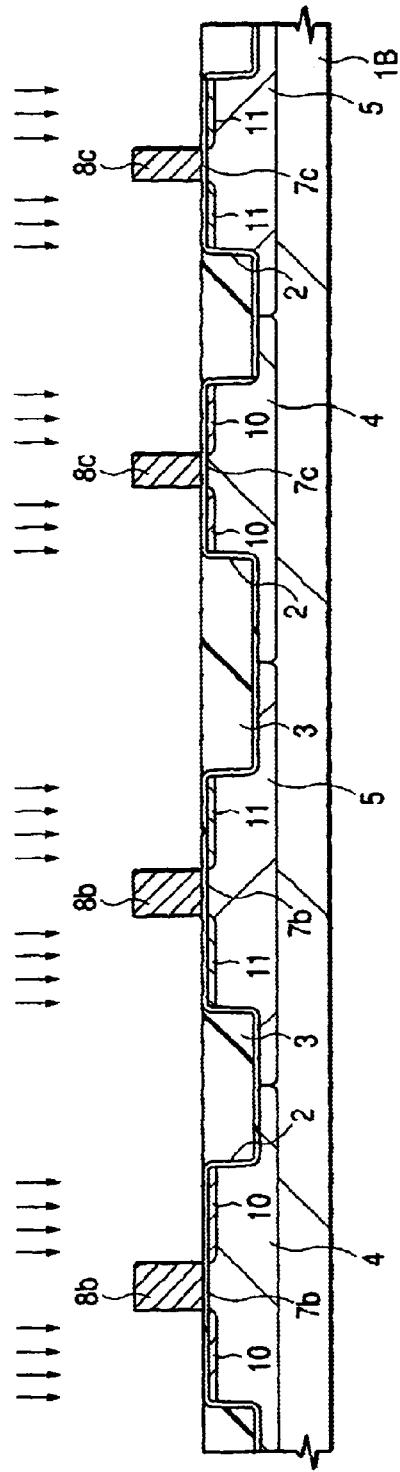

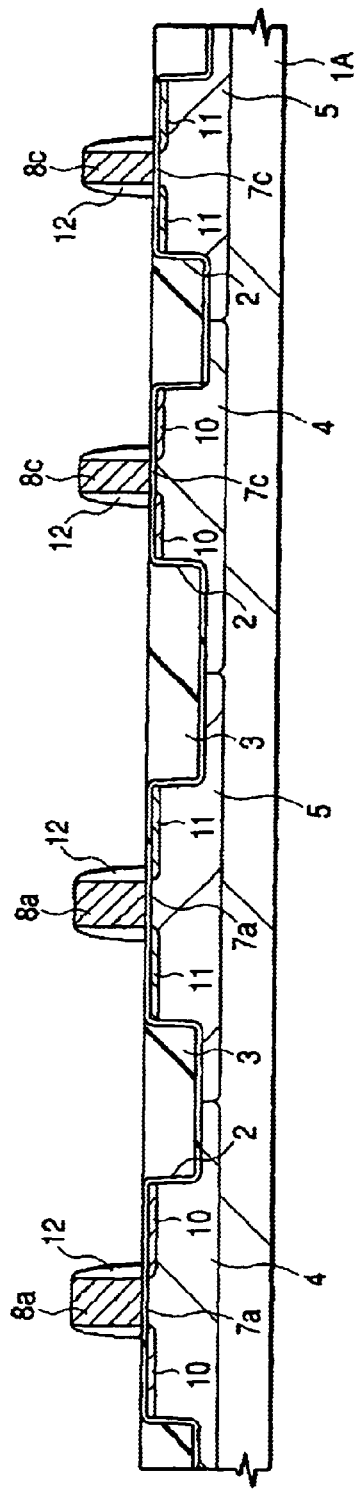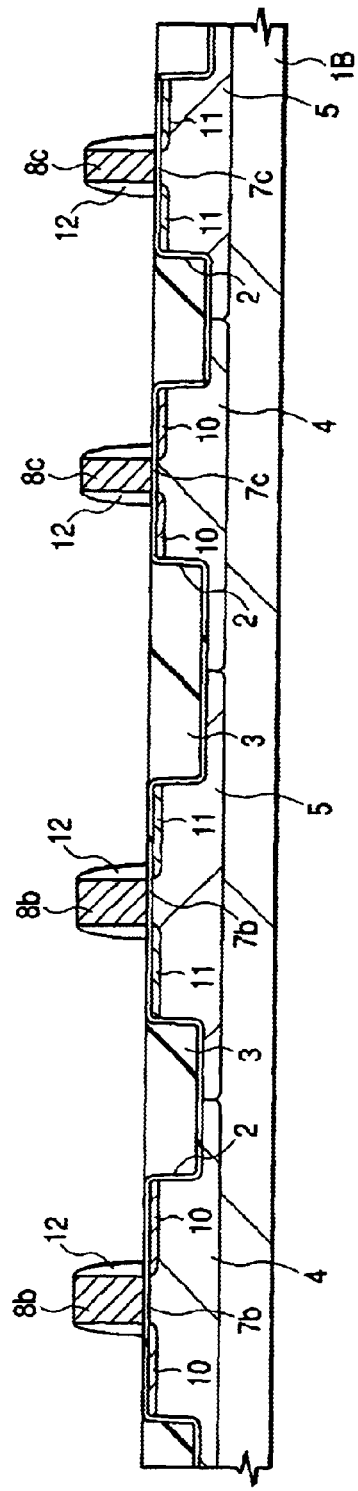
FIG. 16(a)
FIG. 16(b)

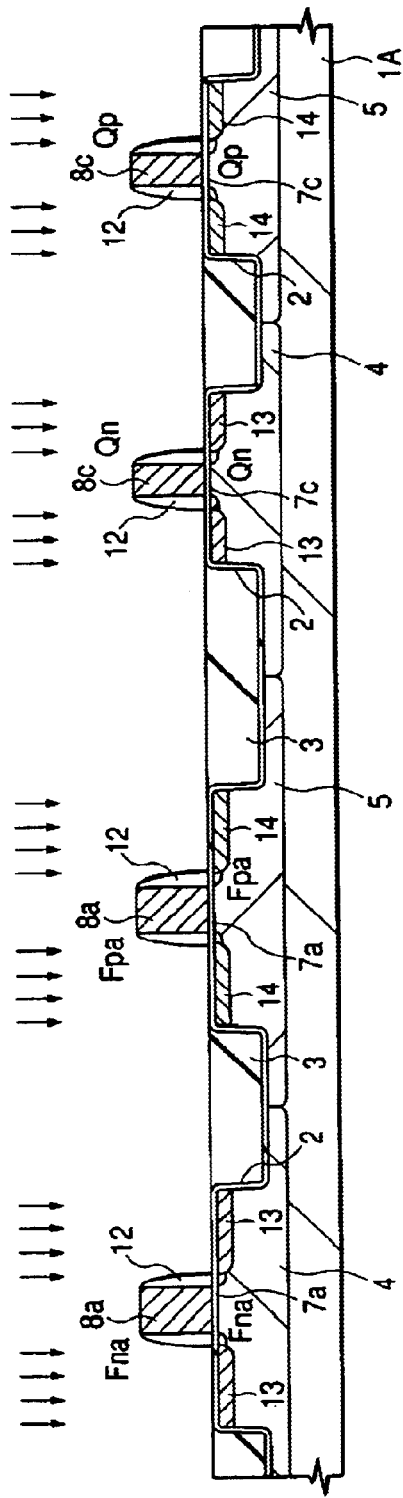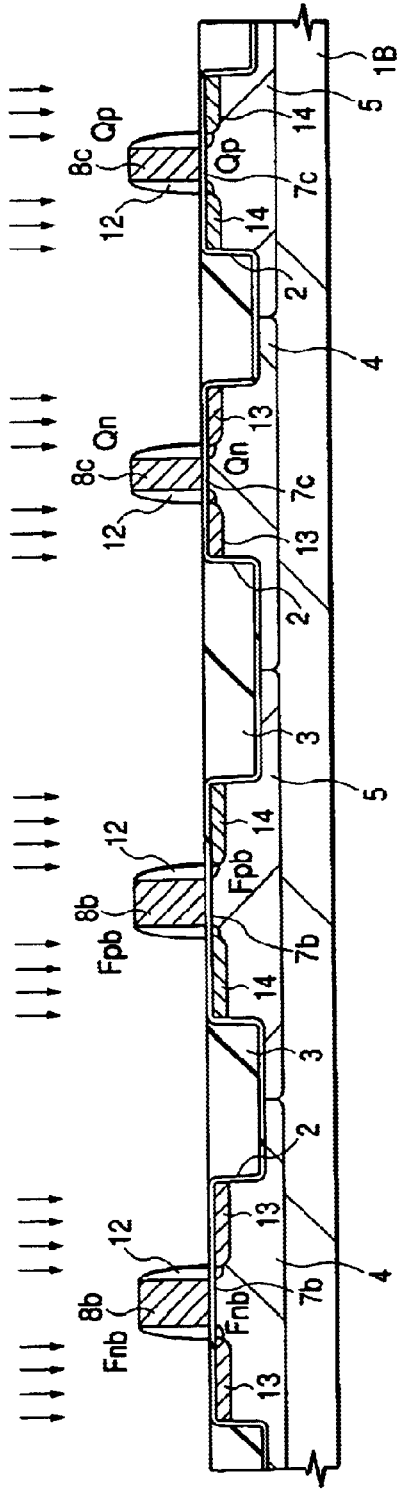

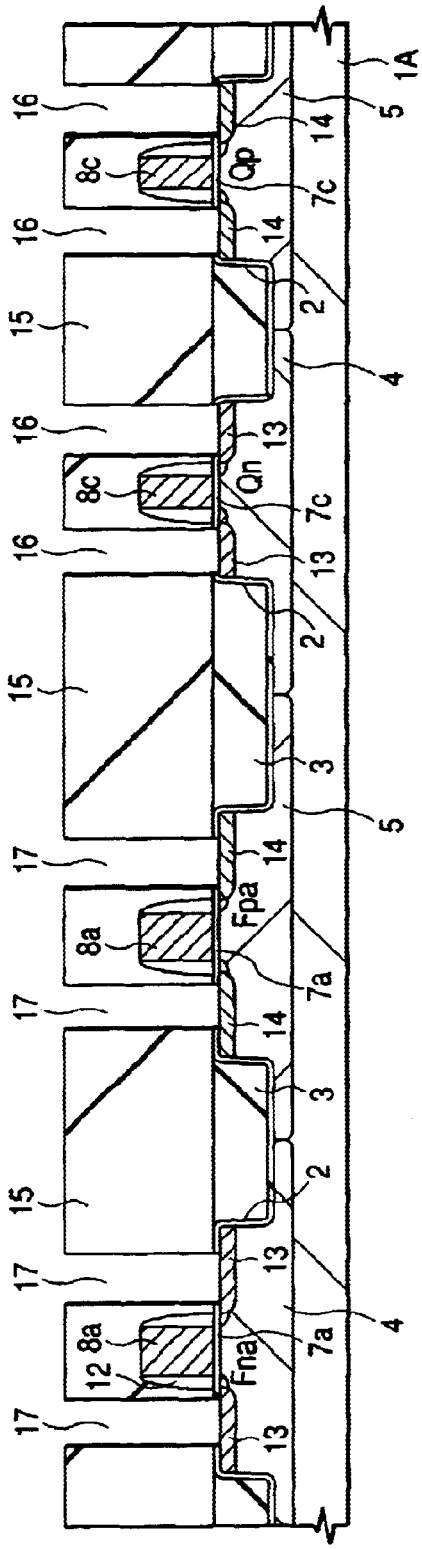
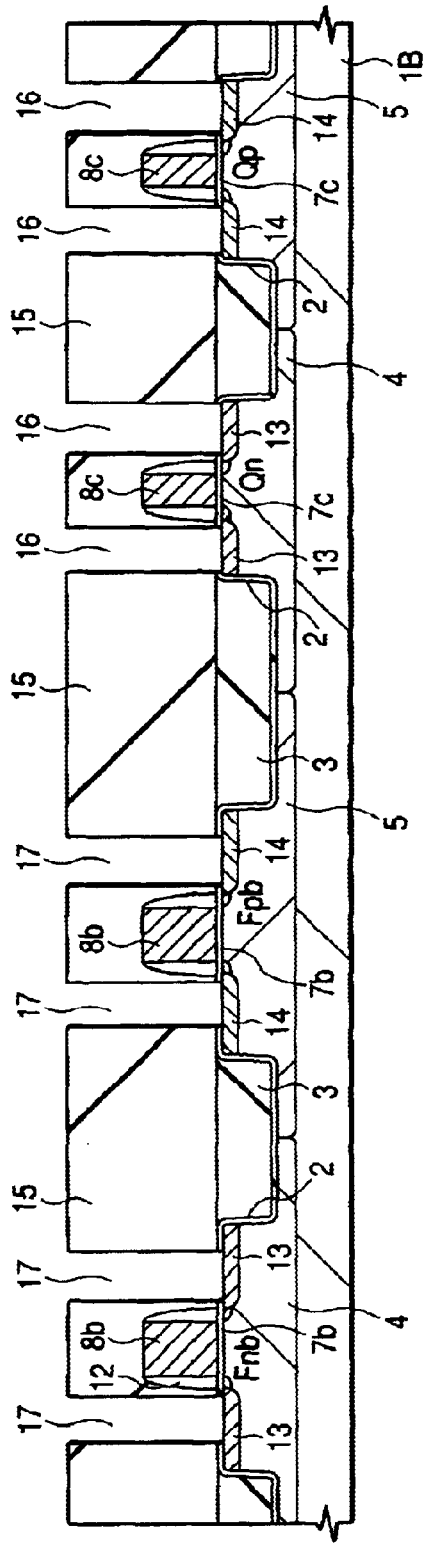
FIG. 18(a)
FIG. 18(b)

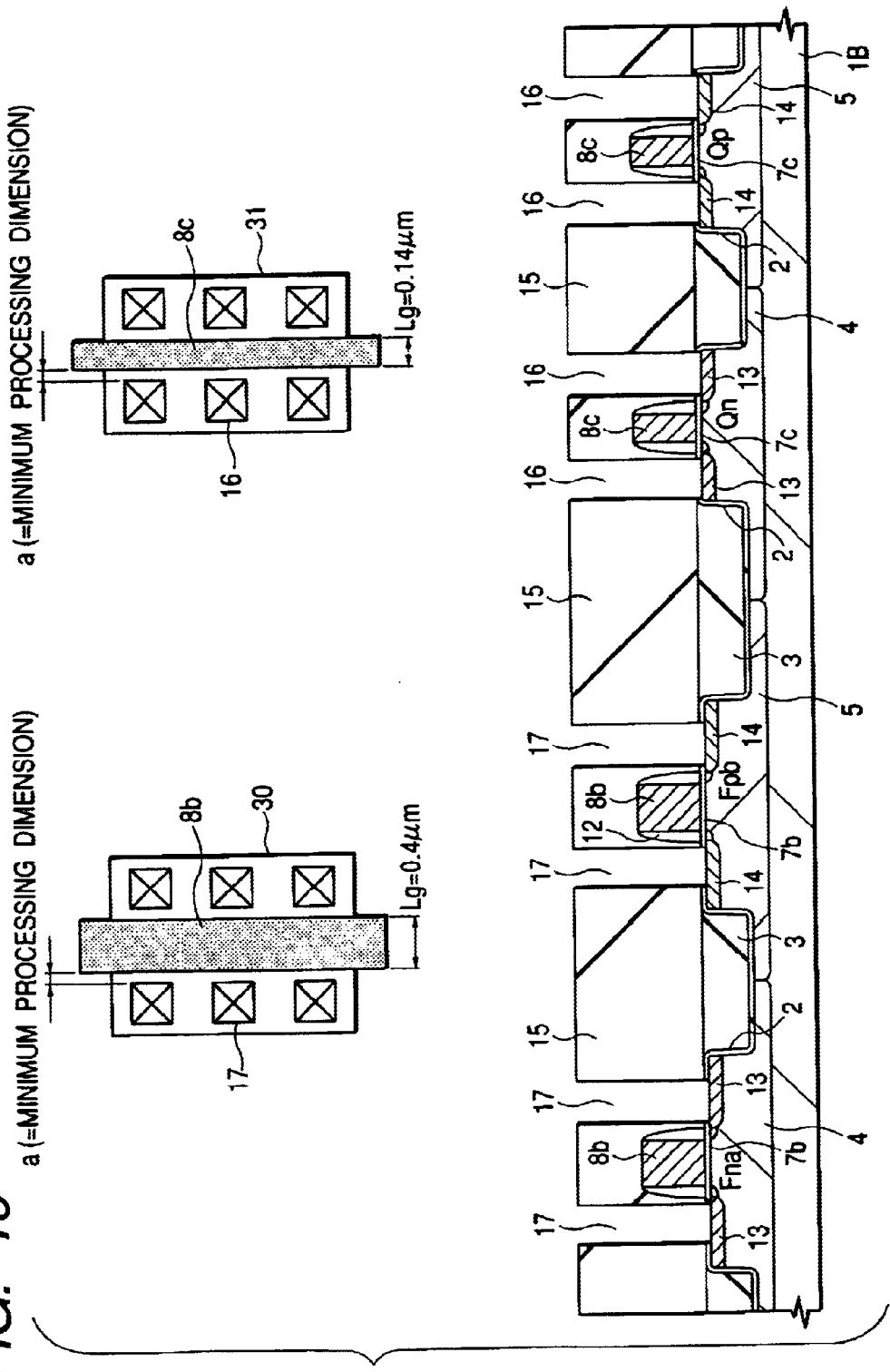

FIG. 26
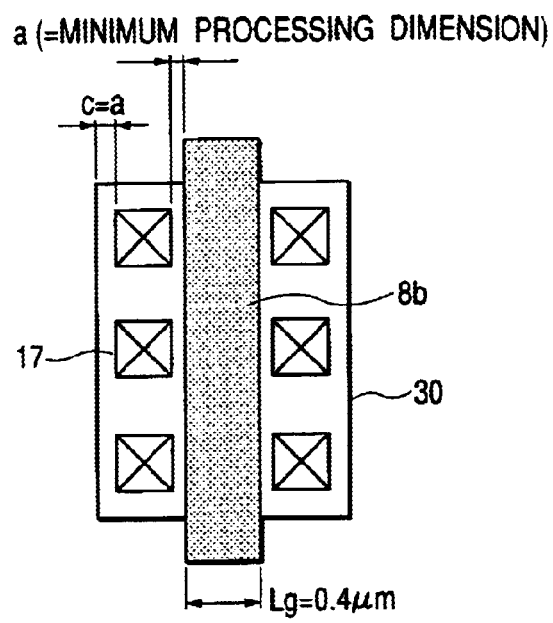
3.3V WITHSTANDING MOS TRANSISTOR
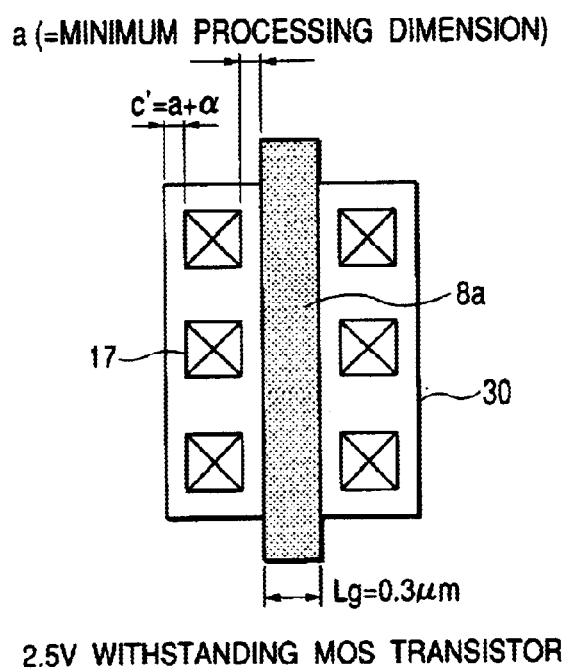
2.5V WITHSTANDING MOS TRANSISTOR

FIG. 27

| SPECIFICATION | SUPPLY VOLTAGE VDD | I/O SUPPLY VOLTAGE VDDQ | INPUT SIGNAL LEVEL VILmin | INPUT SIGNAL LEVEL VIHmax | SUPPLY VOLTAGE INTERNAL CIRCUIT VDDI |
|---|---|---|---|---|---|
| 3.3V SPECIFICATION | 3.3V | 3.3V | 0V | VDDQ | 1.5V |
| 2.5V SPECIFICATION | 2.5V | 1.5V | 0V | VDDQ | 1.5V |

3.3V WITHSTANDING MOS TRANSISTOR 2.5V WITHSTANDING MOS TRANSISTOR

| SPECIFICATION | SUPPLY VOLTAGE VDD | I/O SUPPLY VOLTAGE VDDQ | INPUT SIGNAL LEVEL VILmin | INPUT SIGNAL LEVEL VIHmax | SUPPLY VOLTAGE INTERNAL CIRCUIT VDDI |
|---|---|---|---|---|---|
| 3.3V SPECIFICATION | 3.3V | 3.3V | 0V | VDDQ | 1.5V |
| 2.5V SPECIFICATION | 2.5V | 2.5V | 0V | VDDQ | 1.5V |

| | GATE INSULATING FILM THICKNESS TOX | MINIMUM PROCESSING GATE LENGTH Lg |
|---|---|---|
| 3.3V WITHSTANDING MOS | 8nm | 0.4μm |
| 2.5V WITHSTANDING MOS | 6nm | 0.3μm |
| 1.5V WITHSTANDING MOS | 3nm | 0.14μm |

SEMICONDUCTOR DEVICE AND METHOD OF MANUFACTURING A SEMICONDUCTOR DEVICE

BACKGROUND OF THE INVENTION

The present invention relates to a semiconductor device and a method of manufacturing the same, specifically to an effective technique for use in the semiconductor device incorporating high-speed ICs conforming to plural external supply voltages.

In general, the supply voltage externally supplied to LSIs formed on a semiconductor chip is not necessarily specified as one type, although the functions of the LSIs are identical. For example, the lower supply voltage is advantageous for higher-speed, or lower power consumption, but the time that the power supply voltage of the system using the LSIs is switched into the lower voltage in the market is not clearly foreseen, and the time comes differently depending on the users or the purposes for use. Some systems require modifying the supply voltage specification of the I/O (Input/Output) circuit in view of the noises against the signal.

Accordingly, an LSI manufacturer has to develop different LSIs with one and the same function at the same time, in correspondence with the different specifications of plural external supply voltages. In such a case, to develop the LSIs with the same function individually by each of the supply voltage specifications will require enormous design works, which invites an elongated development term and increased production cost. Therefore, the usual practice searches for common grounds as much as possible in the specifications of the circuits that can be designed commonly, thus enhancing the design efficiency.

SUMMARY OF THE INVENTION

The inventor has examined the circuit configuration of the LSI that has the same function and conforms to the two types of the external supply voltage specifications. The system that the inventor has examined will be outlined as follows.

FIG. 29 illustrates one example of the supply voltage specifications required for an LSI. The two types of external supply voltages (VDD) to be supplied to the LSI are assumed to be 3.3 V and 2.5 V; and the I/O supply voltages (VDDQ) are assumed to be 3.3 V and 2.5 V. The I/O supply voltages (VDDQ) represent the maximum values of the input signal levels that are inputted to the LSI. The internal supply voltages (VDDI) (supply voltages for the internal circuits) are assumed to be 1.5 V in both specifications.

FIG. 30 illustrates one example of the gate insulating film thickness (TOX) and the minimum processing gate length (Lg) of the MOS transistor that is optimized so as to conform to the above three kinds of supply voltages (3.3 V, 2.5 V, 1.5 V). As the supply voltage applied to the MOS transistor increases, the gate insulating film thickness (TOX) becomes thicker, and the minimum processing gate length (Lg) becomes longer accordingly.

FIG. 31 illustrates one example of the LSI circuit construction conforming to the supply voltage specifications shown in FIG. 29. The LSI (000) is composed of an input circuit (001), step-down circuit (002), internal circuit (101), and output circuit (003). The step-down circuit (002) lowers the external supply voltage (VDD) to the internal supply voltage (VDDI), which is supplied to the internal circuit (101). The input circuit (001) and the output circuit (003) are directly supplied with the input signal (IN) and the I/O supply voltage (VDDQ) that varies depending upon the external supply voltage specifications.

In the foregoing circuit construction, by designing the step-down circuit (002) to bring the internal supply voltage (VDDI) into 1.5 V in either case of the external supply voltage (VDD) being 3.3 V and 2.5 V, the design and manufacturing process of the internal circuit (101) can be unified into two types of LSIs. That is, in either of the LSIs, the internal circuit (101) is supplied only with the supply voltage of 1.5 V, and the internal circuit can be formed with MOS transistors having the withstand voltage of 1.5 V shown in FIG. 30.

On the other hand, the input circuit (001) and the output circuit (003) are formed with MOS transistors having such a withstand voltage that prevents breakdown of the gate insulating film even in case of the I/O supply voltage (VDDQ) being high (3.3 V), and the same circuit is also used in case of the I/O supply voltage (VDDQ) being low (2.5 V). That is, the input circuit (001) and the output circuit (003) are configured with the 3.3 V withstanding MOS transistor having the gate insulating film thickness (TOX)=8 nm and the minimum processing gate length (Lg)=0.4 μm, as shown in FIG. 30, in either case of the LSI of 3.3 V specification and the LSI of 2.5 V specification.

FIG. 32 is a circuit diagram illustrating the above circuit construction in detail, and FIG. 33 illustrates the waveforms of the internal operations in this circuit. The MOS transistors (f01, f02) constituting the input circuit (001) and the MOS transistors (f03 to f10) constituting the output circuit (003) are supplied with the I/O supply voltage (VDDQ) and the input signal (IN) that differ depending on the external supply voltage specifications; therefore, the 3.3 V withstanding MOS transistor is used for these, as mentioned above.

However, if this circuit construction is adopted, the I/O supply voltage (VDDQ) is brought into 2.5 V, in case of the LSI with the specification of the external supply voltage (VDD) being 2.5 V; accordingly, the MOS transistor (005) is supplied with less than 2.5 V across the gate and the source thereof. Accordingly, the current drive capability of the MOS transistors (f01 to f10) is extremely lowered, since these transistors are optimized at 3.3 V, which creates a problem that increases the delay times of the input circuit (001) and the output circuit (003).

FIG. 34 illustrates the second example of the LSI circuit construction conforming to the supply voltage specifications shown in FIG. 29. This example forms inside the LSI (000) the input circuit (001a) and the output circuit (003a) configured with the 3.3 V MOS transistor having the gate insulating film thickness (TOX)=8 nm and the minimum processing gate length (Lg)=0.4 μm, and the input circuit (001b) and the output circuit (003b) configured with the 2.5 V MOS transistor (006) having the gate insulating film thickness (TOX)=6 nm and the minimum processing gate length (Lg)=0.3 μm. Further, when the LSI of 3.3 V specification is manufactured, the wiring (010) of 3.3 V specification is connected in the wiring formation step, and when the LSI of 2.5 V specification is manufactured, the wiring (011) of 2.5 V specification is formed.

When the second circuit construction is adopted, it is possible to avoid the problem of increasing the delay times of the input circuit (001) and the output circuit (003), in the LSI with the specification of the external supply voltage (VDD) being 2.5 V. However, in either of the LSI of 2.5 V specification and the LSI of 3.3 V specification, the size of the input/output circuit becomes double, compared with the first circuit construction, which leads to a problem that increases the chip size and the production cost.

The present invention has been made in view of these circumstances, and it is an object of the invention to provide a system that realizes the high-speed operation of a semiconductor device that conforms to plural supply voltage specifications.

Another object of the invention is to provide a system that reduces the production cost of a semiconductor device conforming to plural supply voltage specifications.

Another object of the invention is to provide a system that shortens the development term of a semiconductor device conforming to plural supply voltage specifications.

The above and other objects and novel features of the invention will become apparent from the descriptions and accompanying drawings of this specification.

In accordance with one aspect of the invention, the semiconductor device includes an input circuit or an output circuit configured with a plurality of first MOS transistors in a first area of a principal plane on a semiconductor substrate, and an internal circuit configured with a plurality of second MOS transistors in a second area of the principal plane on the semiconductor substrate, in which a spacing between a first gate electrode of the first MOS transistors constituting the input circuit or the output circuit and a first contact hole for connecting a wiring to a source region or a drain region of the first MOS transistors is larger than a minimum processing dimension of the spacing between the first gate electrode and the first contact hole, and a spacing between a second gate electrode of the second MOS transistors constituting the internal circuit and a second contact hole for connecting a wiring to a source region or a drain region of the second MOS transistors is equal to a minimum processing dimension of the spacing between the second gate electrode and the second contact hole.

In accordance with another aspect of the invention, the semiconductor device includes an input circuit or an output circuit configured with a plurality of first MOS transistors in a first area of a principal plane on a semiconductor substrate, and an internal circuit configured with a plurality of second MOS transistors in a second area of the principal plane on the semiconductor substrate, in which a spacing between an edge of a first active region where the first MOS transistors constituting the input circuit or the output circuit are formed and a first contact hole for connecting a wiring to a source region or a drain region of the first MOS transistors is larger than a minimum processing dimension of the spacing between the edge of the first active region and the first contact hole, and a spacing between an edge of a second active region where the second MOS transistors constituting the internal circuit are formed and a second contact hole for connecting a wiring to a source region or a drain region of the second MOS transistors is equal to a minimum processing dimension of the spacing between the edge of the second active region and the second contact hole.

In accordance with another aspect of the invention, the method of manufacturing a semiconductor device includes plural processes for forming plural types of MOS transistors to which different power supply voltages are applied in correspondence with external power supply voltages, in which the plural processes are composed of a process common to the plural types of MOS transistors and a process different by each of the plural types of MOS transistors.

In accordance with another aspect of the invention, the method of manufacturing a semiconductor device includes the steps of: forming a first semiconductor device configured with a plurality of first MOS transistors, which includes an input circuit or an output circuit supplied with a first external supply voltage, on a principal plane of a first semiconductor wafer, and forming on the principal plane of a second semiconductor wafer a second semiconductor device configured with a plurality of second MOS transistors, including an input circuit or an output circuit supplied with a second external supply voltage different from the first external supply voltage, which has the same function as the first semiconductor device. The plural processes that form the first MOS transistors on the principal plane of the first semiconductor wafer, and the plural processes that form the second MOS transistors on the principal plane of the second semiconductor wafer are composed of a first process common to the first and second MOS transistors, a second process following the first process, which is different in the first MOS transistors and the second MOS transistors, and a third process following the second process, which is common to the first and second MOS transistors.

BRIEF DESCRIPTION OF THE DRAWINGS

FIG. 11 is a sectional view illustrating a process of manufacturing the SRAM as one embodiment of the invention;

FIG. 12 is a sectional view illustrating a process of manufacturing the SRAM as one embodiment of the invention;

FIG. 13 is a sectional view illustrating a process of manufacturing the SRAM as one embodiment of the invention;

FIG. 14 is a sectional view illustrating a process of manufacturing the SRAM as one embodiment of the invention;

FIG. 15 is a sectional view illustrating a process of manufacturing the SRAM as one embodiment of the invention;

FIG. 16 is a sectional view illustrating a process of manufacturing the SRAM as one embodiment of the invention;

FIG. 17 is a sectional view illustrating a process of manufacturing the SRAM as one embodiment of the invention;

FIG. 18 is a sectional view illustrating a process of manufacturing the SRAM as one embodiment of the invention;

FIG. 19 is a plan view and a sectional view illustrating the process of manufacturing the SRAM as one embodiment of the invention;

FIG. 26 is a plan view illustrating a MOS transistor of the SRAM as another embodiment of the invention;

FIG. 27 is a chart illustrating the supply voltage specifications of the SRAM of the invention;

DETAILED DESCRIPTION OF THE PREFERRED EMBODIMENTS

The preferred embodiments of the invention will be described with reference to the accompanying drawings. The components and members having the same functions throughout the drawings are given the same numeric symbols to avoid the repeated explanations.

[Embodiment 1]

Figure 1:
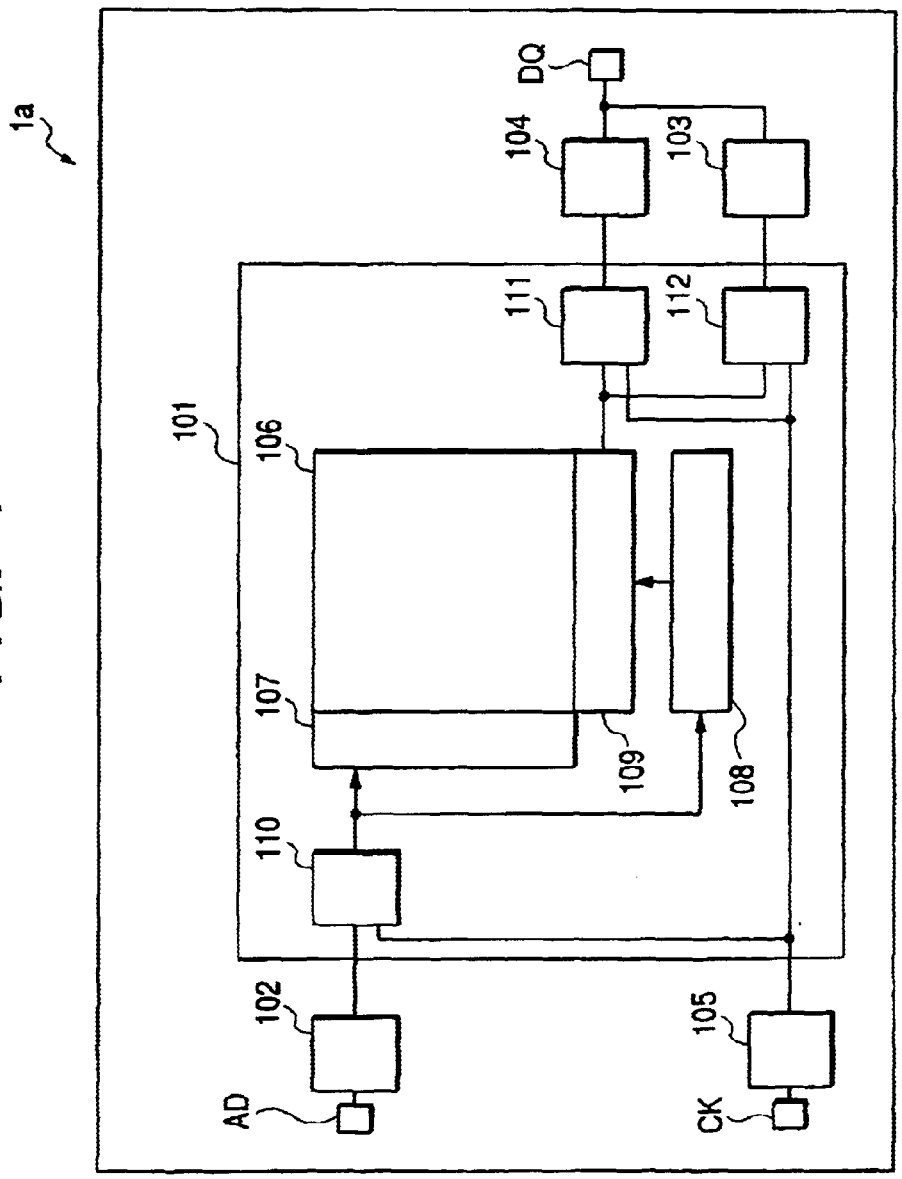
FIG. 1 is a block diagram of a semiconductor chip that incorporates an SRAM as one embodiment of the invention.

FIG. 1 is a circuit block diagram of a silicon chip 1a where an SRAM (Static Random Access Memory) as one embodiment of the invention is formed. This SRAM is a high-speed SRAM having an 8 Megabit storage capacity that is used for a cache memory of a workstation or the like. The SRAM includes an internal circuit 101 that is composed of a memory cell array 106 having plural memory cells formed therein, a row decoder 107, a column decoder 108, a sense amp/write amp 109, an address register 110, a data output register 111, and a data input register 112, etc., and an input/output circuit that is composed of an address input circuit 102, a data input circuit 103, a data output circuit 104, and a clock buffer 105. Through a data input/output pad DQ, a data signal is inputted to the data input circuit 103, and is outputted from the data output circuit 104. An address input signal is inputted to the address input circuit 102 through an address input pad AD. A clock signal is inputted to the clock buffer 105 through a clock input pad CK.

Figures 29, 30, 31:
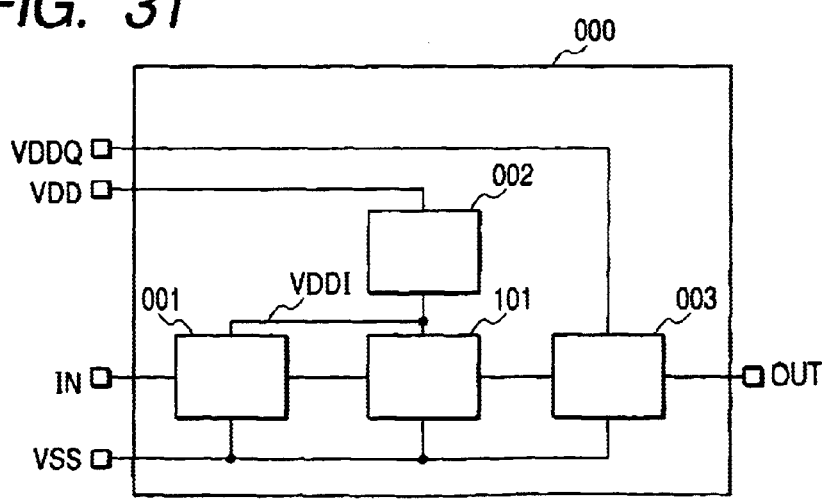
FIG. 29 is a chart illustrating one example of the supply voltage specifications required for an LSI.
FIG. 30 is a chart illustrating one example of the gate insulating film thickness (TOX) and the minimum processing gate length (Lg) of a MOS transistor to be optimized to conform to the supply voltages shown in FIG. 29.
FIG. 31 is a block diagram illustrating one example of an LSI circuit configuration that conforms to the supply voltage specifications shown in FIG. 29.
Figure 32:
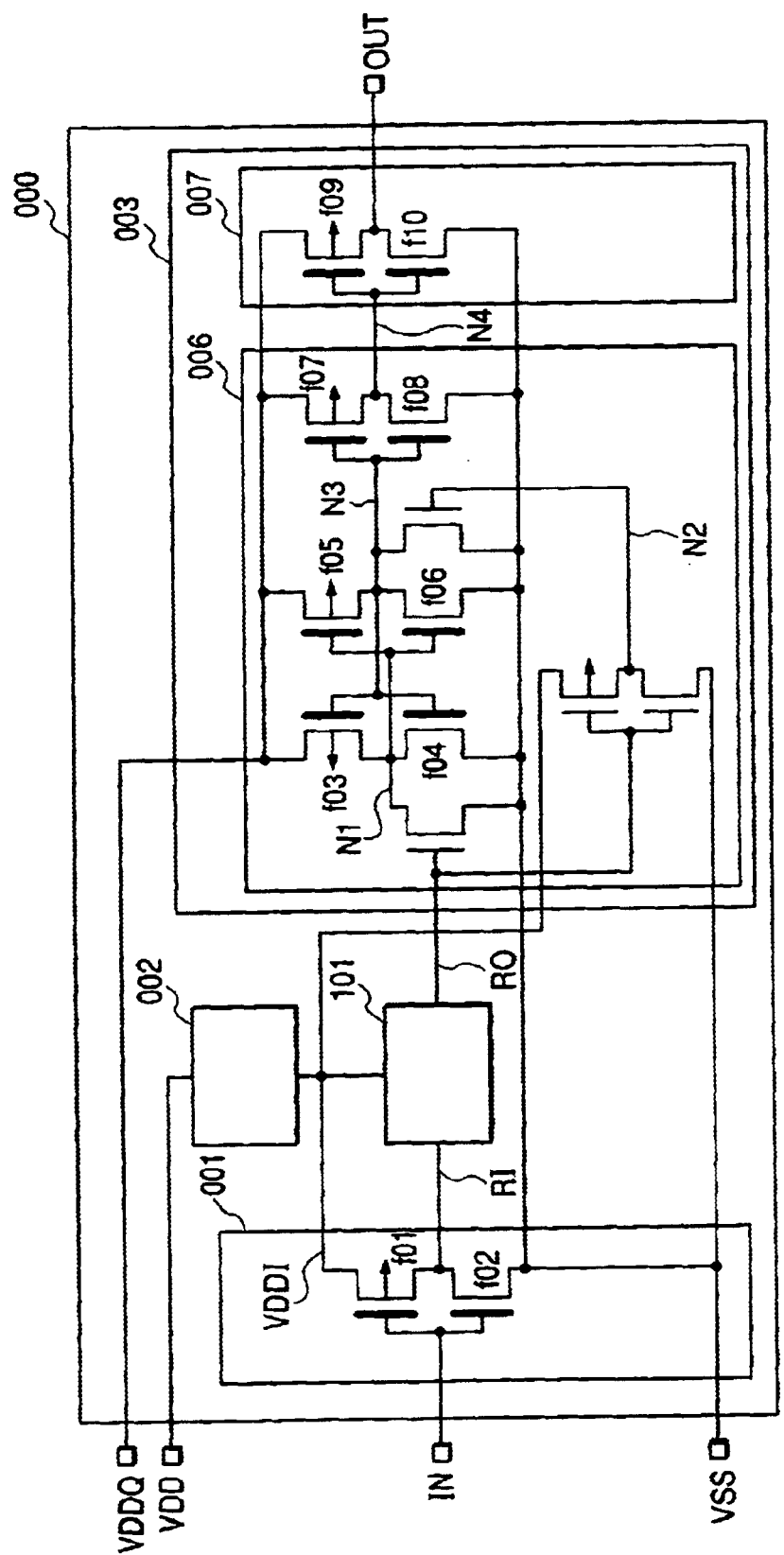
FIG. 32 is a detailed circuit diagram of a part of the circuit shown in FIG. 31.
Figure 33:
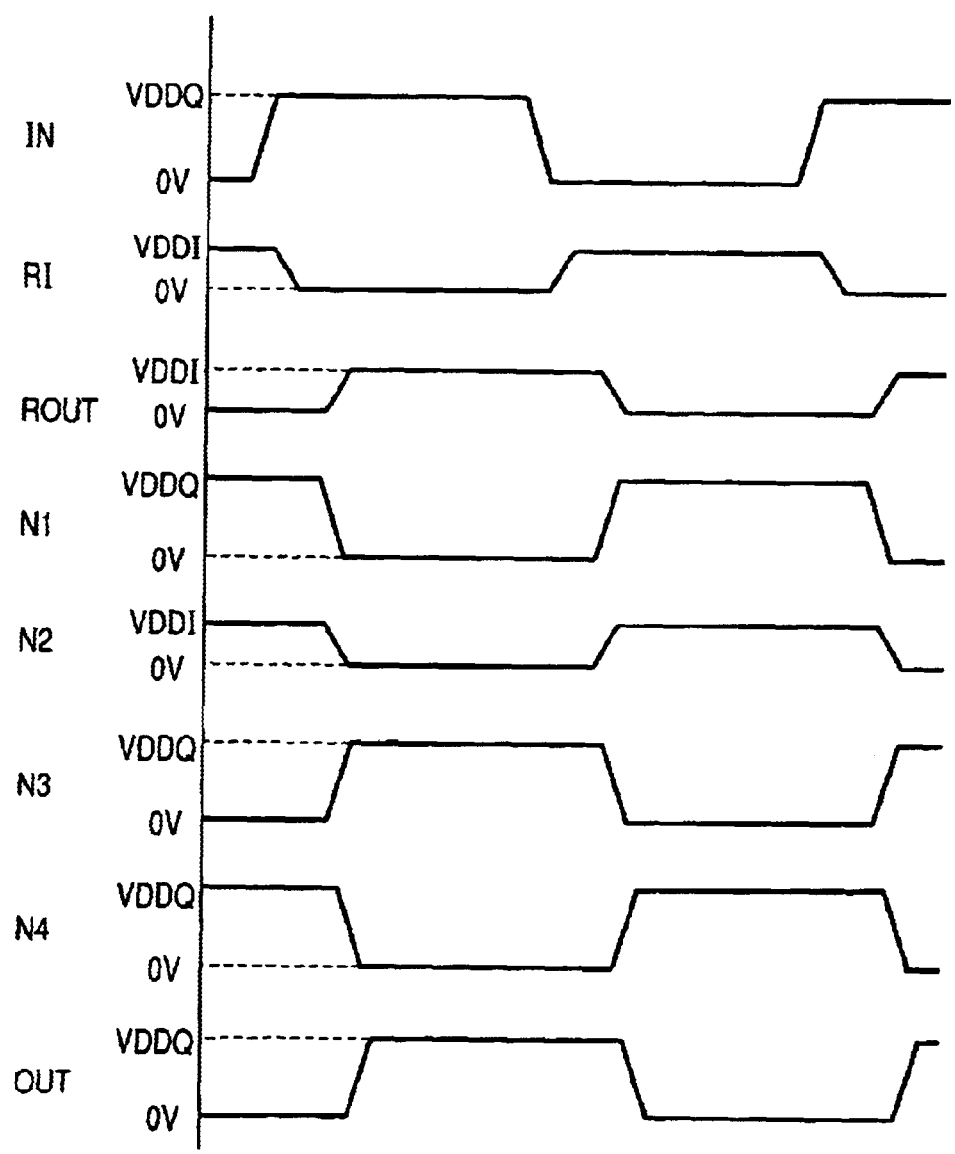
FIG. 33 is a chart illustrating the waveforms of internal operations in the circuit shown in FIG. 32.
Figure 34:
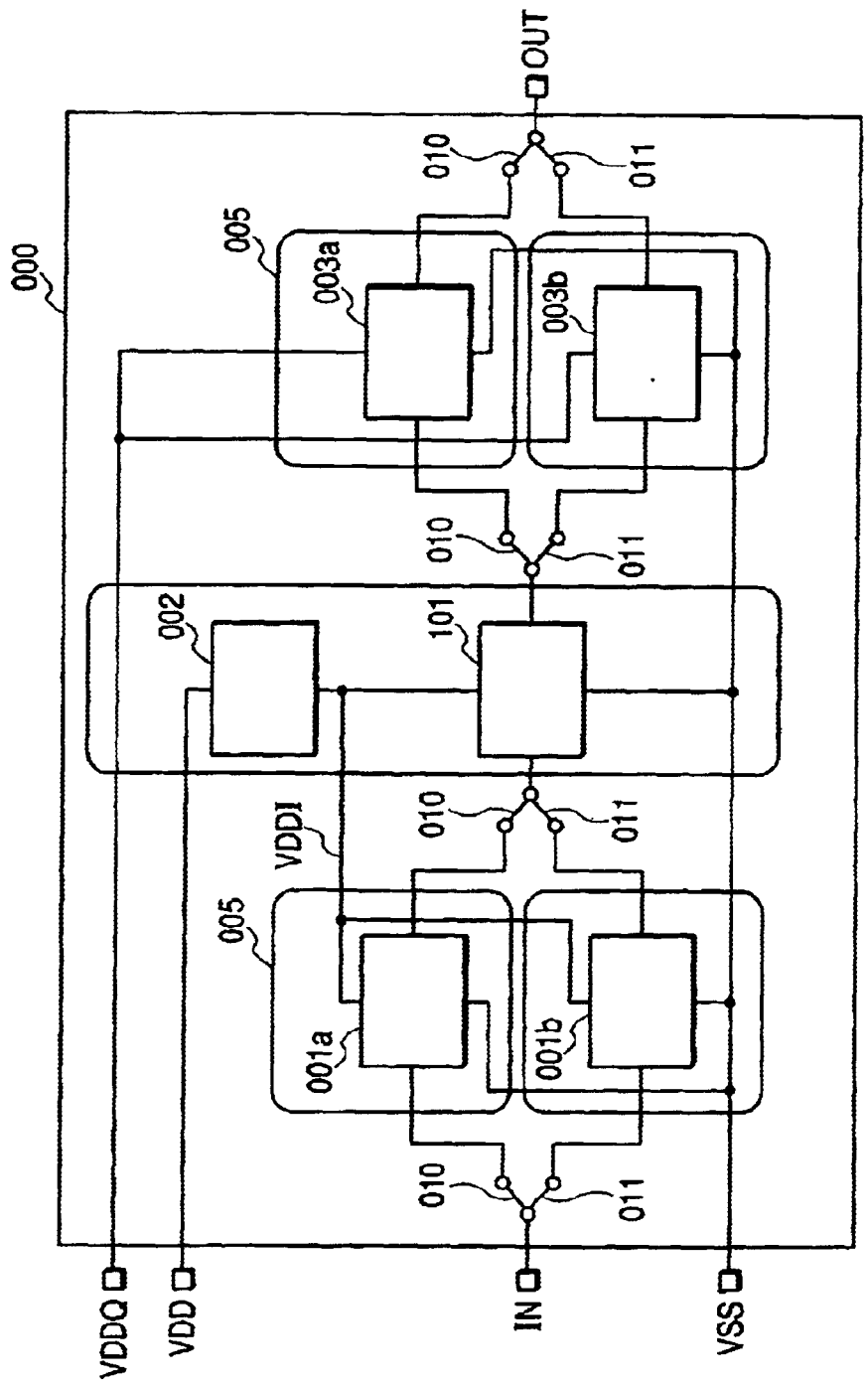
FIG. 34 is a block diagram illustrating another example of the LSI circuit configuration that conforms to the supply voltage specifications shown in FIG. 29.

The SRAM formed on the silicon chip 1a is supplied with the lower voltage (2.5 V) of the two types (3.3 V and 2.5 V) of the external supply voltages (VDD) as shown in FIG. 29, in correspondence with the specifications. The I/O supply voltage (VDDQ) being the maximum value of the input signal level inputted to the SRAM is 2.5 V, which is the same as the external supply voltage (VDD). Further, the internal circuit 101 is designed to operate with the internal supply voltage (VDDI) of 1.5 V, which is lower than the external supply voltage (VDD), in order for higher speed and lower power consumption.

Figure 2:
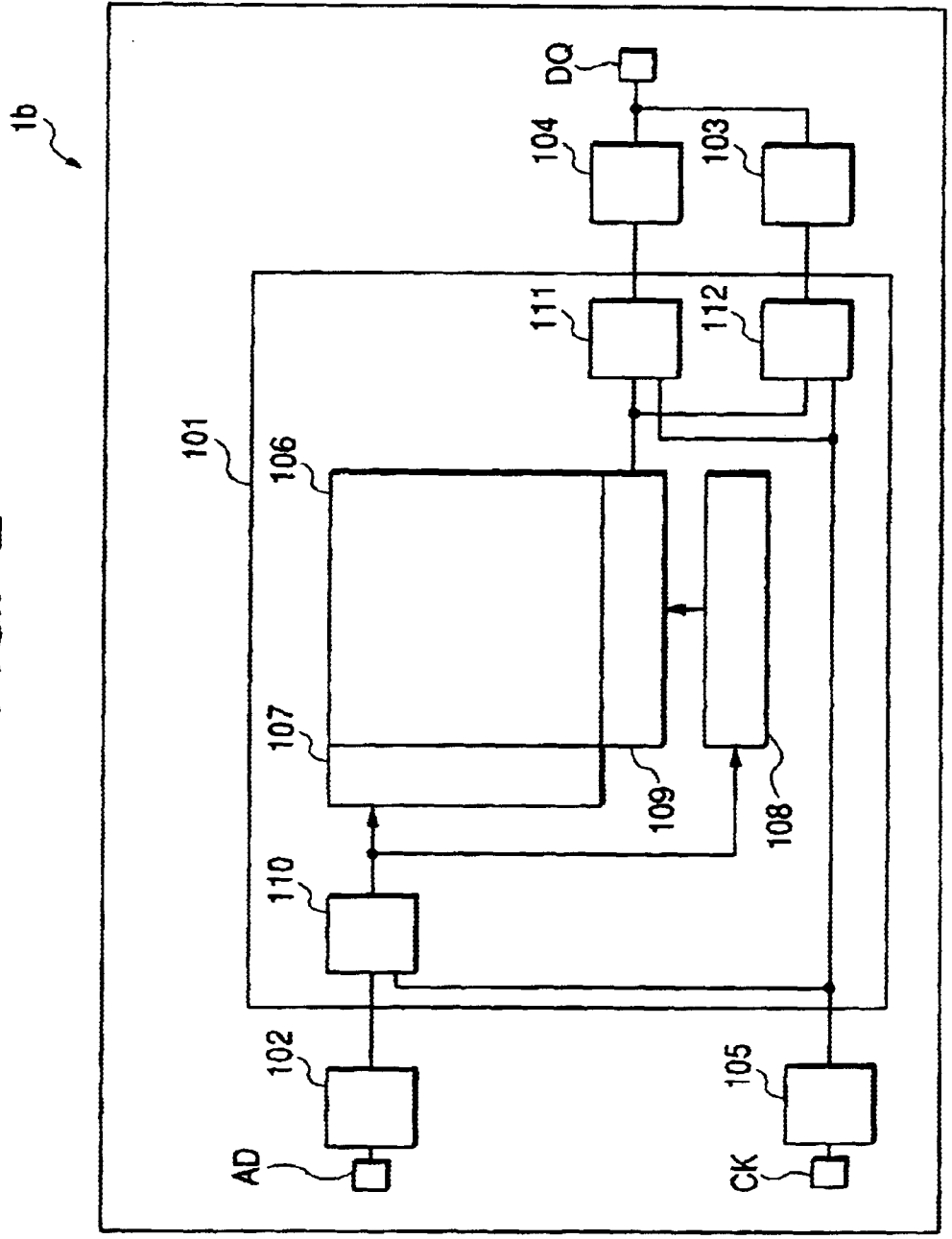
FIG. 2 is a block diagram of a semiconductor chip that incorporates an SRAM as one embodiment of the invention.

FIG. 2 is a circuit block diagram of an 8 Megabit high-speed SRAM formed on another silicon chip 1b. This SRAM has the same function as the SRAM formed on the silicon chip 1a, and the same degree of integration. However, this SRAM is supplied with the higher voltage (3.3 V) of the two types (3.3 V and 2.5 V) of the external supply voltages (VDD), in correspondence with the specifications. The I/O supply voltage (VDDQ) being the maximum value of the input signal level inputted to this SRAM is 3.3 V, which is the same as the external supply voltage (VDD). Further, the internal circuit 101 is designed to operate with the internal supply voltage (VDDI) of 1.5 V, which is lower than the external supply voltage (VDD), in order for higher speed and lower power consumption.

With regard to the SRAM formed on the first silicon chip 1a and the SRAM formed on the second silicon chip 1b, only part of the MOS transistors constituting the input/output circuit are different, but the other circuits are made up with the same MOS transistors. That is, the SRAM formed on the silicon chip 1a is optimized so that the MOS transistors constituting the input/output circuit can operate at a high speed with the supply voltage of 2.5 V; and the SRAM formed on the silicon chip 1b is optimized so that the MOS transistors constituting the input/output circuit can operate at a high speed with the supply voltage of 3.3 V. These two types of SRAMs are furnished with the step-down circuits that supply the internal circuit 101 with the internal supply voltage (VDDI) of 1.5 V, in either case of 3.3 V and 2.5 V for the external supply voltage (VDD).

Figure 3:
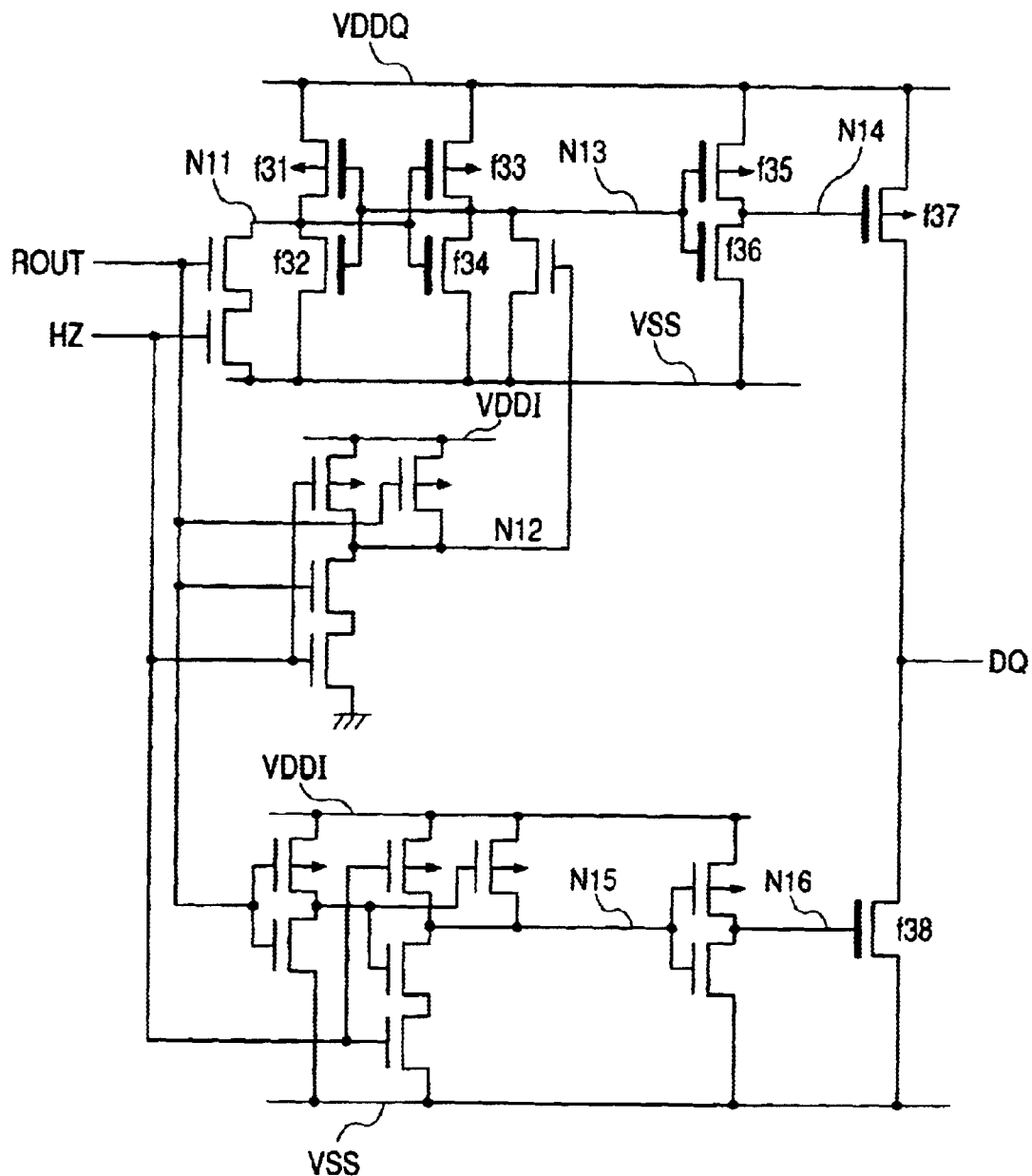
FIG. 3 is a circuit diagram illustrating a data output circuit of the SRAM as one embodiment of the invention.
Figure 4:
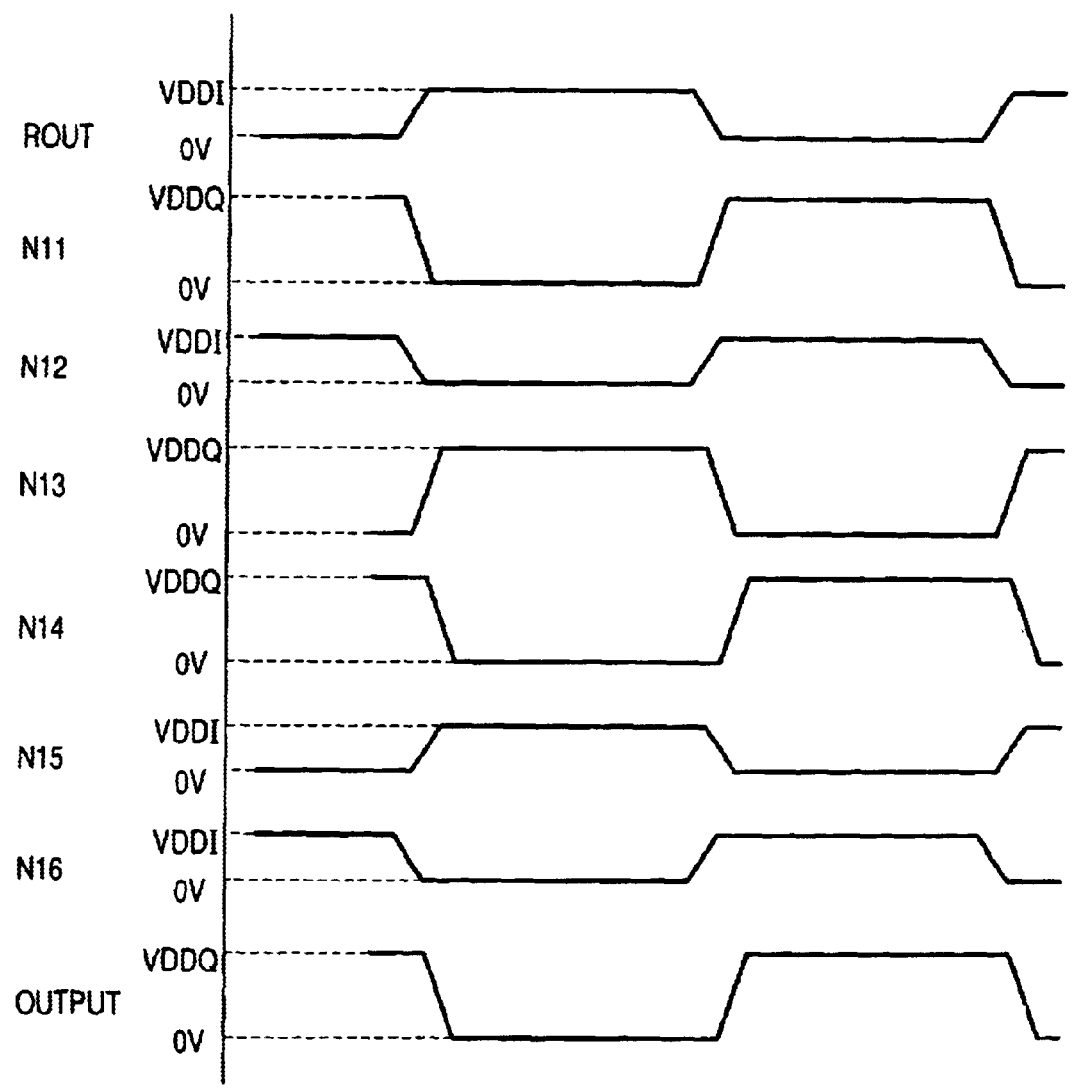
FIG. 4 is a chart illustrating waveforms of internal operations in the data output circuit shown in FIG. 3.

FIG. 3 is a concrete circuit diagram of the data output circuit 104, and FIG. 4 is a waveform chart illustrating the internal operations of the data output circuit 104.

Among the MIS transistors that constitute the data output circuit 104, the n-channel MOS transistors (f32, f34, f36) and the p-channel MOS transistors (f31, f33, f35, f37) are directly supplied with the I/O supply voltage (VDDQ) that differs depending on the external supply voltage specifications. Therefore, the MOS transistors (f31 to f37) formed on the silicon chip 1a are designed to withstand 2.5 V so as to exhibit the high-speed performance when the I/O supply voltage (VDDQ) of 2.5 V is supplied thereto. On the other hand, the MOS transistors (f31 to f37) formed on the silicon chip 1b are designed to withstand 3.3 V so as to exhibit the high-speed performance when the I/O supply voltage (VDDQ) of 3.3 V is supplied thereto. The other MOS transistors of the data output circuit 104 are designed to withstand 3.3 V for both the silicon chip 1a and 1b, so that they can be used with the two kinds of supply voltages (2.5 V, 3.3 V).

Figure 5:
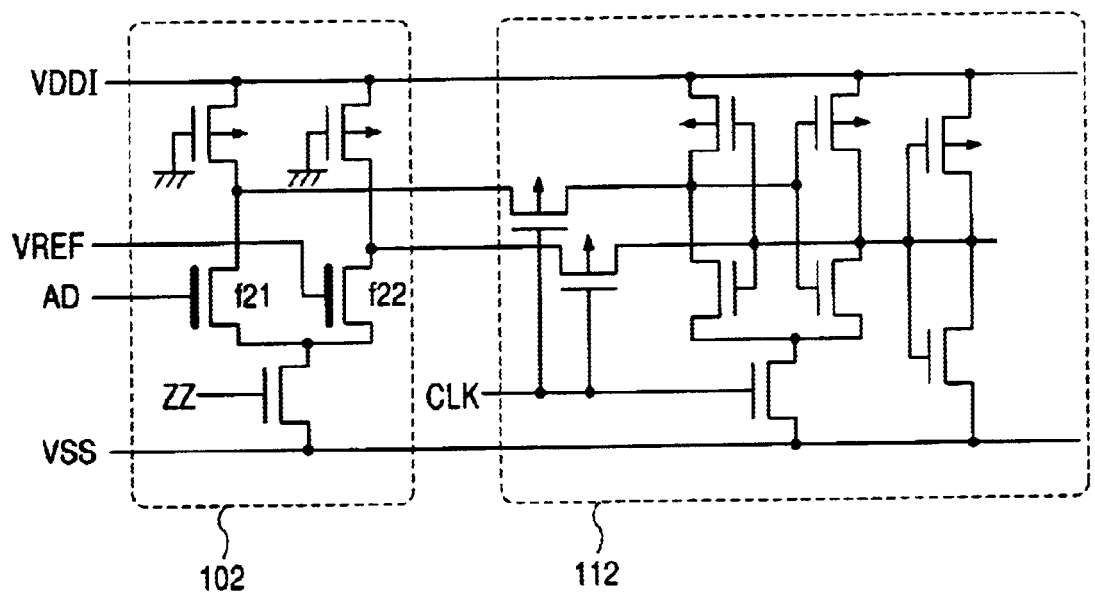
FIG. 5 is a circuit diagram illustrating an address input circuit and a data input register of the SRAM as one embodiment of the invention.
Figure 6:
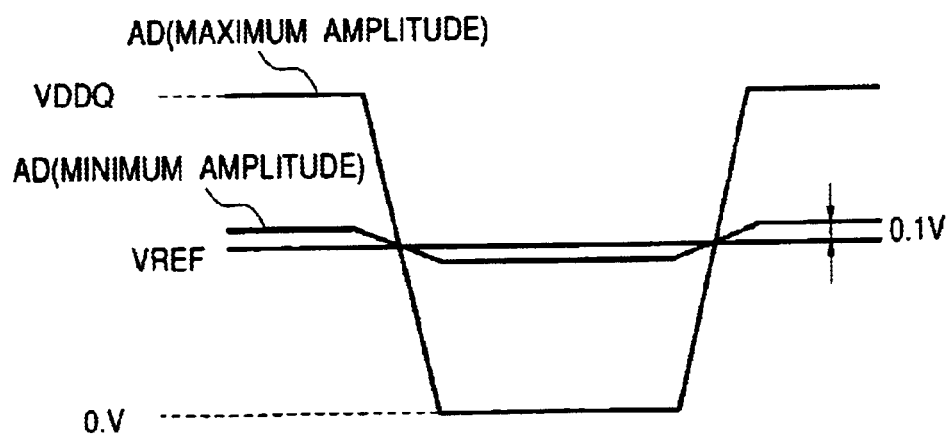
FIG. 6 is a chart illustrating the amplitude of the address input signal inputted to the address input circuit shown in FIG. 5.

FIG. 5 is a concrete circuit diagram of the address input circuit 102 and the data input register 112, and FIG. 6 is a waveform chart illustrating the address input signal AD inputted to the address input circuit 102.

As shown in FIG. 6, usually the address input signal AD is a small amplitude signal appeared against the reference voltage (VREF); however, when it takes the maximum amplitude, the address input signal AD becomes the same voltage as the I/O supply voltage (VDDQ). Therefore, the MOS transistors (f21 and f22) formed on the silicon chip 1a are designed to withstand 2.5 V so as to exhibit the high-speed performance when the I/O supply voltage (VDDQ) of 2.5 V is supplied thereto. On the other hand, the MOS transistors (f21 and f22) formed on the silicon chip 1b are designed to withstand 3.3 V so as to exhibit the high-speed performance when the I/O supply voltage (VDDQ) of 3.3 V is supplied thereto.

Figure 7A:
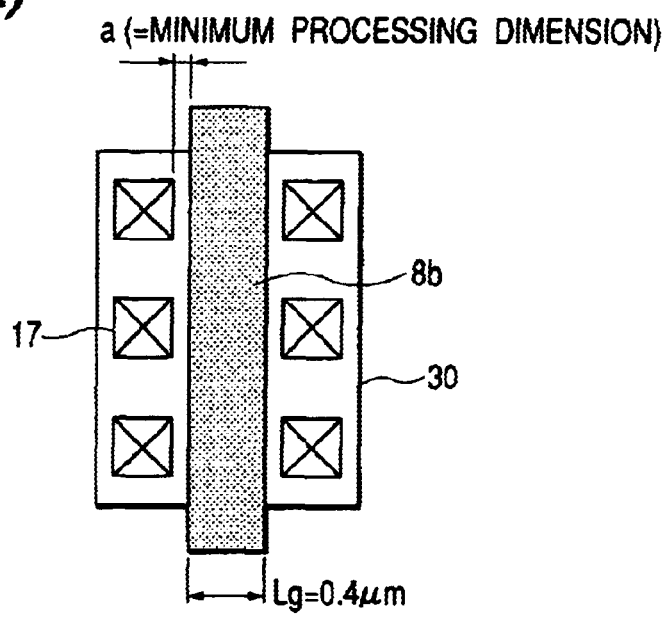
FIG. 7(a) is a plan view of a 3.3 V withstanding MOS transistor formed on the first silicon chip.
Figure 7B:
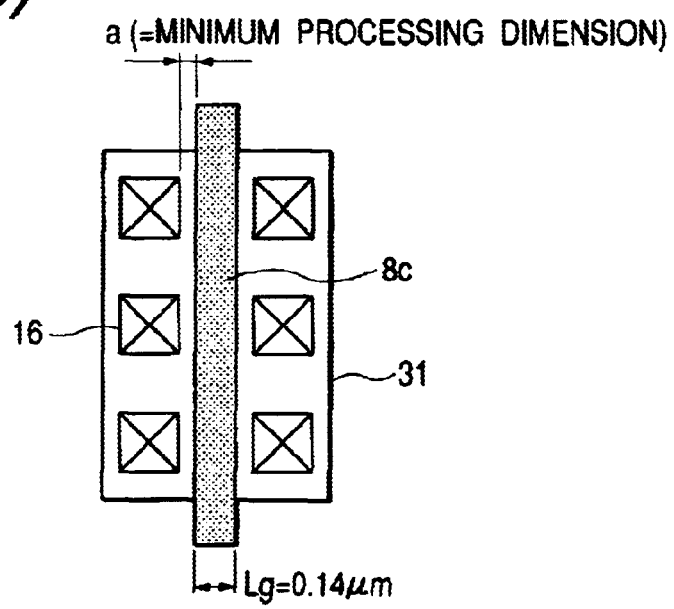
FIG. 7(b) is a plan view of a 1.5 V withstanding MOS transistor formed on the second silicon chip.

FIG. 7(*a*) is a plan view of the 3.3 V withstanding MOS transistor formed on the silicon chip 1b, and FIG. 7(*b*) is a plan view of the 1.5 V withstanding MOS transistor formed on the same silicon chip 1b. The 3.3 V withstanding MOS transistor and the 1.5 V withstanding MOS transistor each have the gate insulating film thickness (TOX) and the minimum processing gate length (Lg) as shown in FIG. 30. In the 3.3 V withstanding MOS transistor, the spacing between the gate electrode 8b and the contact hole 17 for connecting the source and drain regions to the wiring region is formed in the minimum processing dimension (a) of this spacing, in order to promote the microstructure. Also, in the 1.5 V withstanding MOS transistor, the spacing between the gate electrode 8c and the contact hole 16 for connecting the source and drain regions to the wiring region is formed in the minimum processing dimension (a) of this spacing, from the same reason.

Figure 8A:
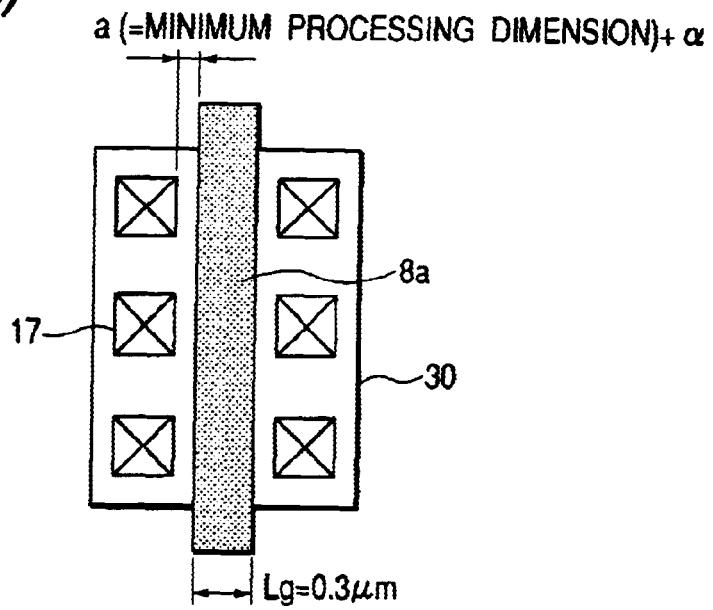
FIG. 8(a) is a plan view of a 2.5 V withstanding MOS transistor formed on the first silicon chip.
Figure 8B:
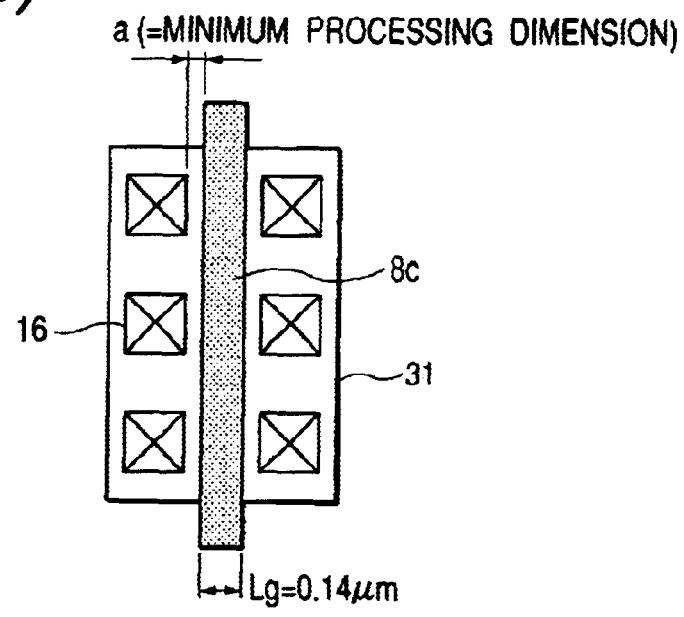
FIG. 8(b) is a plan view of a 1.5 V withstanding MOS transistor formed on the second silicon chip.

FIG. 8(*a*) is a plan view of the 2.5 V withstanding MOS transistor formed on the silicon chip 1a, and FIG. 8(*b*) is a plan view of the 1.5 V withstanding MOS transistor formed on the same silicon chip 1a. The 2.5 V withstanding MOS transistor and the 1.5 V withstanding MOS transistor each have the gate insulating film thickness (TOX) and the minimum processing gate length (Lg) as shown in FIG. 30.

The 1.5 V withstanding MOS transistors constituting the SRAM internal circuit 101 take on the common structure to the silicon chips 1a and 1b. That is, the 1.5 V withstanding MOS transistor formed on the silicon chip 1a and the 1.5 V withstanding MOS transistor formed on the silicon chip 1b are formed on an active region 31 that has the same size, thus having the same gate insulating film thickness (TOX) and the gate length (Lg). Also, the spacing between the gate electrode 8c and the contact hole 16 for connecting the source and drain regions to the wiring region is formed identically in the minimum processing dimension (a) of this spacing.

On the other hand, the 2.5 V withstanding MOS transistor formed on the silicon chip 1a and the 3.3 V withstanding MOS transistor formed on the silicon chip 1b are formed on an active region 30 that has the same size, but the gate insulating film thickness (TOX) and the gate lengths (Lg) of the above two types of transistors are different from each other. Therefore, if the spacing between the gate electrode 8b and the contact hole 17 of the 3.3 V withstanding MOS transistor is formed in the minimum processing dimension (a) of this spacing, the spacing between the gate electrode 8b and the contact hole 17 of the 2.5 V withstanding MOS transistor having the shorter gate length (Lg) will be increased by α against the minimum processing dimension (a) of this spacing. Here, α is equal to half the difference between the minimum processing gate length (Lg) of the 3.3 V withstanding MOS transistor and the minimum processing gate length (Lg) of the 2.5 V withstanding MOS transistor.

Next, the method of manufacturing the SRAM of the 3.3 V specification and the SRAM of the 2.5 V specification will be explained with reference to FIG. 9 through FIG. 23.

Figure 9:
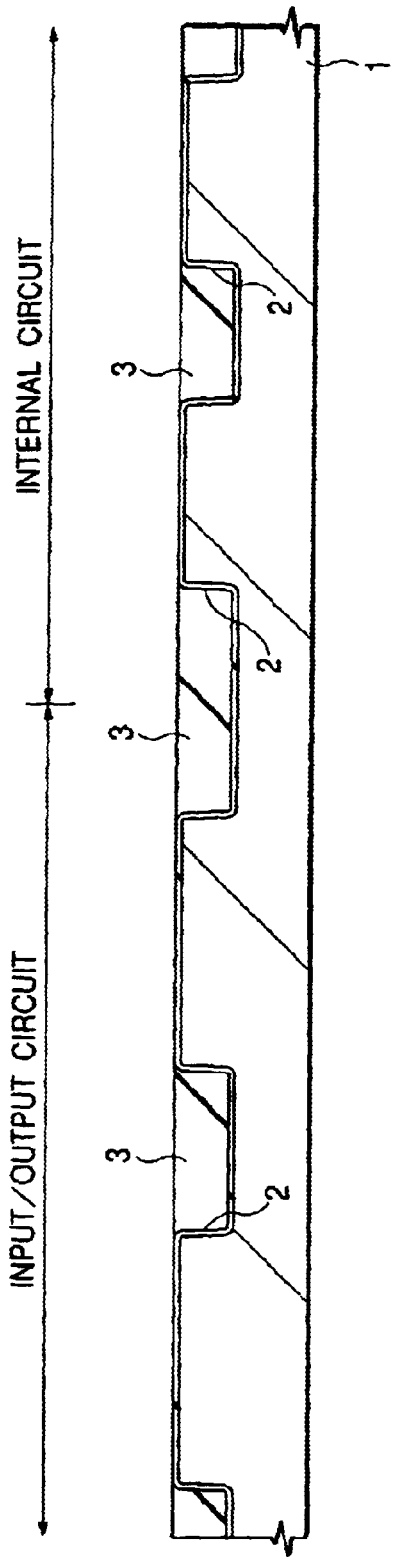
FIG. 9 is a sectional view illustrating a process of manufacturing the SRAM as one embodiment of the invention.

First, as shown in FIG. 9, a device isolation groove 2 is formed on the principal plane of a silicon wafer 1 (hereunder, also referred to as a substrate) made of the p-type single crystal silicon having a specific resistance of about 1 to 10 Ωcm. The device isolation groove 2 is formed through the processing: etching a device isolation region on the substrate 1 to form a groove, next depositing a silicon oxide film 3 on the substrate 1 including the inside of the groove by means of the CVD method, and then polishing to remove the silicon oxide film 3 on the outside of the groove by means of the CMP (Chemical Mechanical Polishing).

Figure 10:
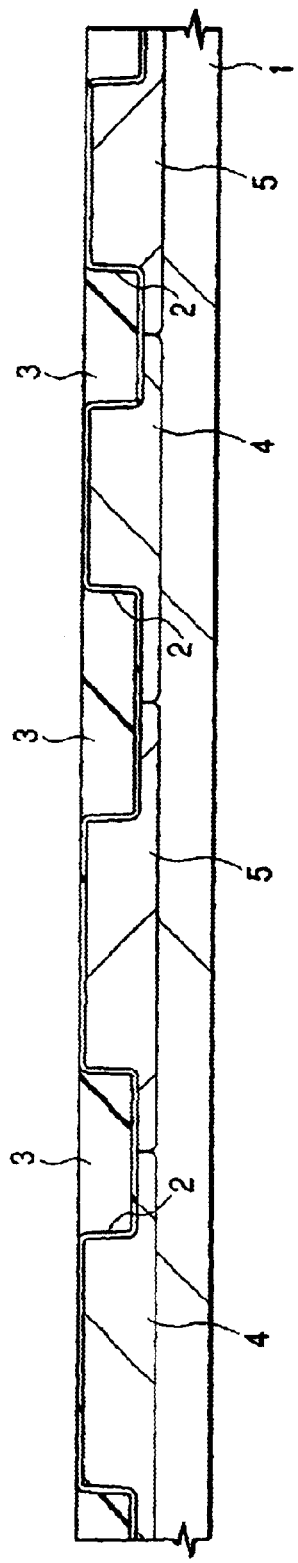
FIG. 10 is a sectional view illustrating a process of manufacturing the SRAM as one embodiment of the invention.

Next, as shown in FIG. 10, the processing advances to executing the ion implantation of the n-type impurities (for example, phosphorus) to one part of the substrate 1, and executing the ion implantation of the p-type impurities (for example, boron) to the other one part of the substrate 1, and then executing the heat treatment of the substrate 1 to diffuse the impurities, thereby forming the p-type well 4 on the one part of the substrate 1 and the n-type well 5 on the other one part thereof.

The manufacturing method in this embodiment stores multiple sheets of the silicon wafers 1 on which the above wells (p-type well 4, n-type well 5) have been formed, by each lot. After the production quantities of the SRAM of the 3.3 V specification and the SRAM of the 2.5 V specification are fixed, these silicon wafers 1 are classified into a silicon wafer 1A used for manufacturing the SRAM of the 2.5 V specification and a silicon wafer 1B used for manufacturing the SRAM of the 3.3 V specification, and the following processing is applied to the silicon wafer 1A and the silicon wafer 1B.

First, as shown in FIG. 11(*a*), after the surface of the silicon wafer 1A of the 2.5 V specification is cleaned with hydrofluoric acid, the wet oxidation is applied to form a clean silicon oxide film 6a on each of the surfaces of the p-type well 4 and the n-type well 5. Also, as shown in FIG. 11(*b*), after the surface of the silicon wafer 1B of the 3.3 V specification is cleaned with hydrofluoric acid, the wet oxidation is applied to form a clean silicon oxide film 6b on each of the surfaces of the p-type well 4 and the n-type well 5. The wet oxidation to the silicon wafer 1B takes a longer time (or applies a higher temperature) in comparison to the silicon wafer 1A, so that the thickness of the silicon oxide film 6b is made slightly thicker than that of the silicon oxide film 6a.

Next, as shown in FIG. 12(*a*), the input/output circuit area of the silicon wafer 1A is overlaid with a photo resist film 40, and the wet etching with hydrofluoric acid is applied thereon, to remove the gate insulating film 6a in the internal circuit area. Also, as shown in FIG. 12(*b*), the input/output circuit area of the silicon wafer 1B is overlaid with a photo resist film 41, and the same method as above is applied to remove the gate insulating film 6b in the internal circuit area.

Next, after the photo resist film 40 on the silicon wafer 1A is removed, as shown in FIG. 13(*a*), the wet oxidation is applied to the silicon wafer 1A, whereby a gate oxide film 7c of 3 nm thick is formed on each of the surfaces of the p-type well 4 and the n-type well 5 in the internal circuit area. This wet oxidation will thicken the silicon oxide film 6a in the input/output circuit area, which forms a gate oxide film 7a of 6 nm thick on each of the surfaces of the p-type well 4 and the n-type well 5 in the input/output circuit area.

Also, after the photo resist film 41 on the silicon wafer 1B is removed, as shown in FIG. 13(b), the wet oxidation is applied to the silicon wafer 1B, whereby the gate oxide film 7c of 3 nm thick is formed on each of the surfaces of the p-type well 4 and the n-type well 5 in the internal circuit area. This wet oxidation will thicken the silicon oxide film 6b in the input/output circuit area, which forms a gate oxide film 7b of 8 nm thick on each of the surfaces of the p-type well 4 and the n-type well 5 in the input/output circuit area.

Next, as shown in FIG. 14(a), a gate electrode 8a of the gate length 0.3 μm is formed in the input/output circuit area of the silicon wafer 1A, and the gate electrode 8c of the gate length 0.14 μm is formed in the internal circuit area. The gate electrodes 8a, 8c are formed in an example through the processing of: depositing an n-type polycrystal silicon film on the silicon wafer 1A by the CVD method, and thereafter patterning this polycrystal silicon film by the dry etching with the photo resist film served as the mask.

Next, as shown in FIG. 14(b), the gate electrode 8b of the gate length 0.4 μm is formed in the input/output circuit area of the silicon wafer 1B, and the gate electrode 8c of the gate length 0.14 μm is formed in the internal circuit area. The gate electrodes 8b, 8c are formed in the same manner as the gate electrodes 8a, 8c, by patterning the n-type polycrystal silicon film deposited on the silicon wafer 1B.

Next, as shown in FIG. 15(a), the ion implantation is executed to the p-type well 4 of the silicon wafer 1A with the n-type impurities (phosphorous or arsenic) to thereby form an n$^-$-type semiconductor region 10, and the ion implantation is executed to the n-type well 5 with the p-type impurities (boron) to thereby form a p$^-$-type semiconductor region 11. Also, as shown in FIG. 15(b), the ion implantation is executed to the p-type well 4 of the silicon wafer 1B with the n-type impurities (phosphorous or arsenic) to thereby form the n$^-$-type semiconductor region 10, and the ion implantation is executed to the n-type well 5 with the p-type impurities (boron) to thereby form the p$^-$-type semiconductor region 11. Here, the n$^-$-type semiconductor region 10 and the p$^-$-type semiconductor region 11 are formed to construct the MOS transistor into the LDD (lightly doped drain) structure.

Next, as shown in FIG. 16(a), a silicon nitride film is deposited on the silicon wafer 1A by the CVD method, and thereafter an anisotropic dry etching is applied to this silicon nitride film to thereby form a side wall spacer 12 on each of the side walls of the gate electrodes 8b, 8c. Also, as shown in FIG. 16(b), the silicon nitride film is deposited on the silicon wafer 1B by the CVD method, and thereafter the anisotropic dry etching is applied to this silicon nitride film to thereby form the side wall spacer 12 on each of the side walls of the gate electrodes 8b, 8c.

Next, as shown in FIG. 17(a), the ion implantation is executed to the p-type well 4 of the silicon wafer 1A with the n-type impurities (phosphorous or arsenic) to thereby form an n$^+$-type semiconductor region (source, drain region) 13, and the ion implantation is executed to the n-type well 5 with the p-type impurities (boron) to thereby form a p$^+$-type semiconductor region (source, drain region) 14. Also, as shown in FIG. 17(b), the ion implantation is executed to the p-type well 4 of the silicon wafer 1B with the n-type impurities (phosphorous or arsenic) to thereby form the n$^+$-type semiconductor region (source, drain region) 13, and the ion implantation is executed to the n-type well 5 with the p-type impurities (boron) to thereby form the p$^+$-type semiconductor region (source, drain region) 14.

The process up to here forms 2.5 V withstanding n-channel MOS transistors Fna and p-channel MOS transistors Fpa in the input/output circuit area of the silicon wafer 1A, and 1.5 V withstanding n-channel MOS transistors Qn and p-channel MOS transistors Qp in the internal circuit area. Also, the process forms 3.3 V withstanding n-channel MOS transistors Fnb and p-channel MOS transistors Fpb in the input/output circuit area of the silicon wafer 1B, and the 1.5 V withstanding n-channel MOS transistors Qn and p-channel MOS transistors Qp in the internal circuit area.

Next, as shown in FIG. 18(a), the process deposits a silicon oxide film 15 on the silicon wafer 1A by the CVD method, thereafter applies the dry etching to the silicon oxide film 15 with the photo resist film (not illustrated) served as the mask, and thereby forms contact holes 17 above each of the source and drain regions (n$^+$-type semiconductor region 13, p$^+$-type semiconductor region 14) of the n-channel MOS transistors Fna and p-channel MOS transistors Fpa in the input/output circuit area, and forms contact holes 16 above each of the source and drain regions (n$^+$-type semiconductor region 13, p$^+$-type semiconductor region 14) of the n-channel MOS transistors Qn and p-channel MOS transistors Qp in the internal circuit area.

Also, as shown in FIG. 18(b), the process deposits a silicon oxide film 15 on the silicon wafer 1B by the CVD method, thereafter applies the dry etching to the silicon oxide film 15 with the photo resist film (not illustrated) served as the mask, and thereby forms contact holes 17 above each of the source and drain regions (n$^+$-type semiconductor region 13, p$^+$-type semiconductor region 14) of the n-channel MOS transistors Fnb and p-channel MOS transistors Fpb in the input/output circuit area, and forms contact holes 16 above each of the source and drain regions (n$^+$-type semiconductor region 13, p$^+$-type semiconductor region 14) of the n-channel MOS transistors Qn and p-channel MOS transistors Qp in the internal circuit area.

As shown in FIG. 19, in regard to the 3.3 V withstanding n-channel MOS transistors Fnb and p-channel MOS transistors Fpb that are formed in the input/output circuit area of the silicon wafer 1B, the spacing between the gate electrode 8b and the contact holes 17 for connecting the wiring regions to the source and drain regions (n$^+$-type semiconductor region 13, p$^+$-type semiconductor region 14) is formed in the minimum processing dimension (a) of this spacing. Also, in the 1.5 V withstanding n-channel MOS transistors Qn and p-channel MOS transistors Qp formed in the internal circuit area, the spacing between the gate electrode 8c and the contact holes 16 for connecting the wiring regions to the source and drain regions (n$^+$-type semiconductor region 13, p$^+$-type semiconductor region 14) is formed in the minimum processing dimension (a) of this spacing.

Figure 20:
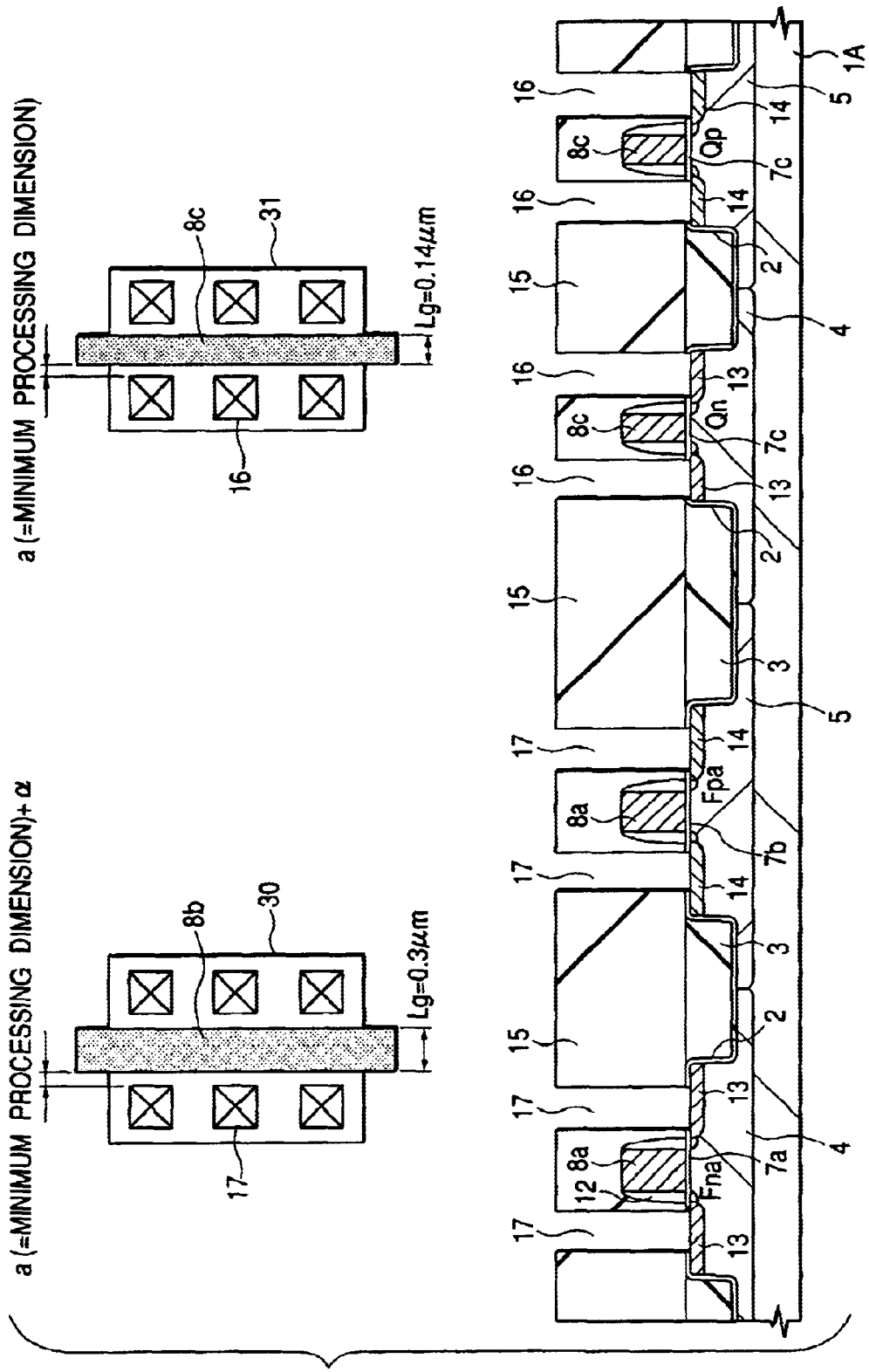
FIG. 20 is a plan view and a sectional view illustrating the process of manufacturing the SRAM as one embodiment of the invention.

As shown in FIG. 20, the 2.5 V withstanding n-channel MOS transistors Fnb and p-channel MOS transistors Fpb formed in the input/output circuit area of the silicon wafer 1A are formed on the active region 30 that has the same size as the active region 30 where the 3.3 V withstanding n-channel MOS transistors Fnb and p-channel MOS transistors Fpb are formed. Therefore, with regard to the 2.5 V withstanding n-channel MOS transistors Fnb and p-channel MOS transistors Fpb, the spacing between the contact holes 17 and the gate electrode 8a is increased in comparison to the minimum processing dimension (a) of this spacing.

Figure 21:
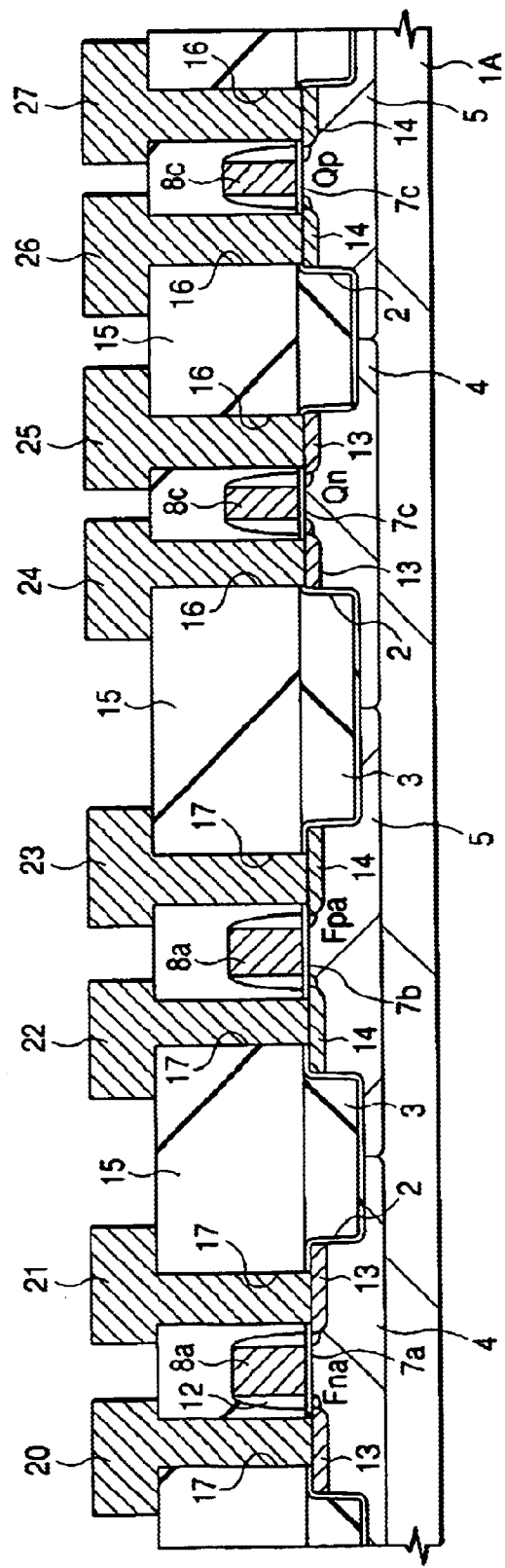
FIG. 21 is a sectional view illustrating a process of manufacturing the SRAM as one embodiment of the invention.
Figure 22:
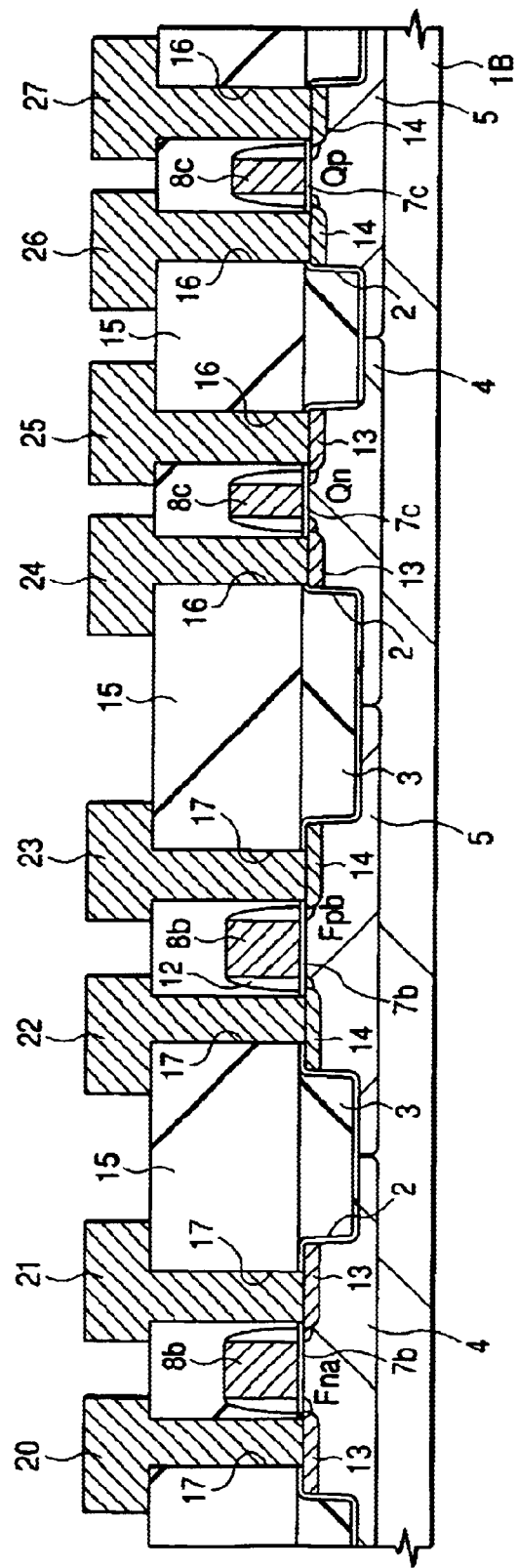
FIG. 22 is a sectional view illustrating a process of manufacturing the SRAM as one embodiment of the invention.
Figure 23:
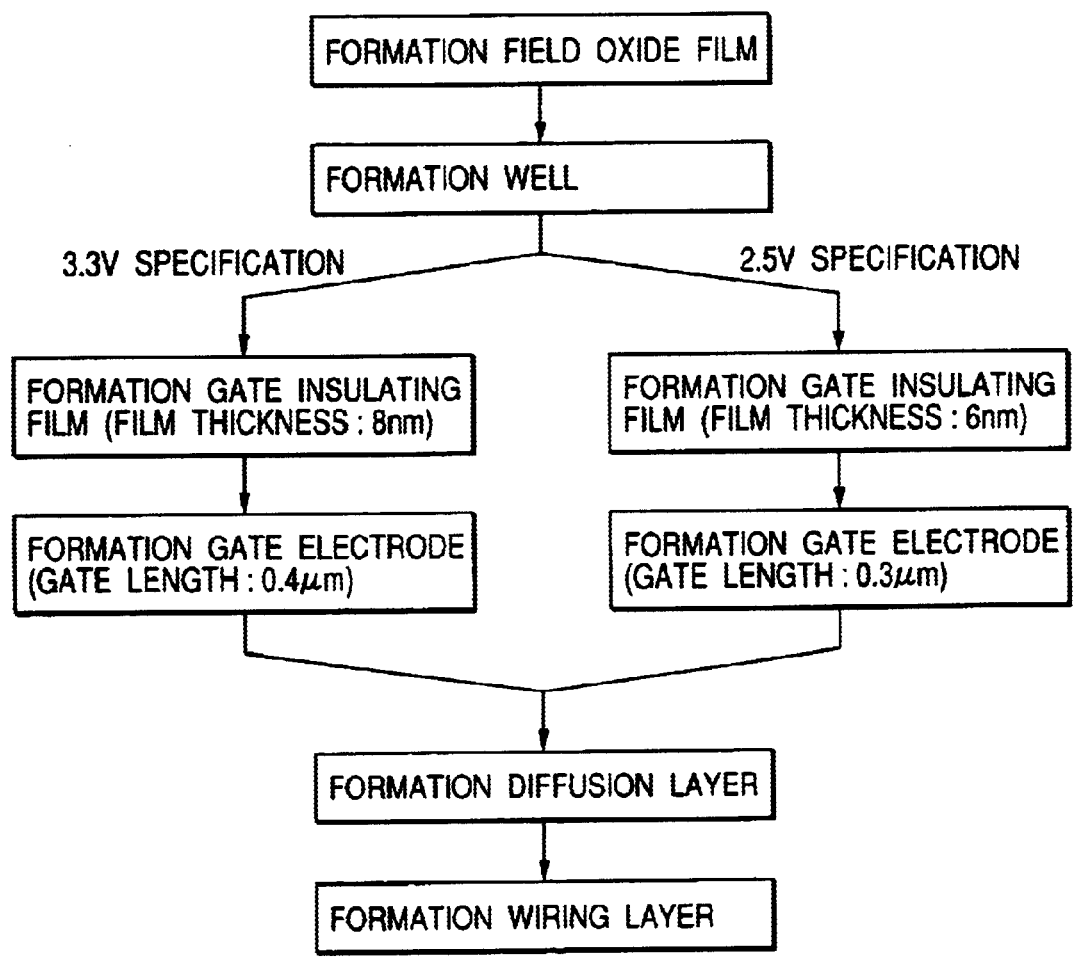
FIG. 23 is a flow chart illustrating a process of manufacturing the SRAM as one embodiment of the invention.

Next, as shown in FIG. 21, metal wirings 20 to 27 are formed on the silicon wafer 1A; and, as shown in FIG. 22, metal wirings 20 to 27 are formed on the silicon wafer 1B. The metal wirings 20 to 27 are formed, for example, through the processing of: depositing an aluminum alloy film on the silicon oxide film 15 including the insides of the contact holes 16, 17 by the sputtering method, and patterning the aluminum alloy film by the dry etching with the photo resist film served as the mask. The metal wirings 20 to 27 on the silicon wafer 1A and the metal wirings 20 to 27 on the silicon wafer 1B are formed in the same manner with the same photo mask.

The actual SRAM has the metal wirings of about three layers to overlie the metal wirings 20 to 27, but the detailed explanation will be omitted. These metal wirings are formed by the same system using the same photo mask to the silicon wafer 1A and the silicon wafer 1B, as the metal wirings 20 to 27. Thereafter, the silicon wafer 1A is divided into plural silicon chips 1a, and the silicon wafer 1B is divided into plural silicon chips 1b, thus attaining the silicon chip 1a in which the SRAM of 2.5 V specification is formed, as shown in FIG. 1, and the silicon chip 1b in which the SRAM of 3.3 V specification is formed, as shown in FIG. 2.

Thus, according to this embodiment, in the construction of the SRAM of 2.5 V specification, the input/output circuit is configured with the 2.5 V withstanding MOS transistors, and in the construction of the SRAM of 3.3 V specification, the input/output circuit is configured with the 3.3 V withstanding MOS transistors. Thereby, both the 2.5 V withstanding MOS transistors and the 3.3 V withstanding MOS transistors attain the sufficient current drive capability, and the SRAMs of both specifications will achieve a higher performance speed of the input/output circuit.

Further, according to this embodiment, the input/output circuit configured with the 2.5 V withstanding MOS transistors and the input/output circuit configured with the 3.3 V withstanding MOS transistors are not needed to be formed in one and the same chip, which restricts the increase of the chip size, thus leading to an inexpensive high-speed SRAM.

Further, according to this embodiment, the greater part of the manufacturing process can be made common as to the two types of SRAMs conforming to the specifications of the external supply voltages, which lightens the design work in comparison to the case of designing the SRAMs of the same function individually by each of the supply voltage specifications, thereby shortening the development term and reducing the manufacturing cost.

Furthermore, according to this embodiment, the arrangements on production can be made which store the silicon wafers having completed part of the manufacturing process common to the two types of the SRAMs, and after fixing the production quantities, manufacture the two types of the SRAMs with the silicon wafers. Thereby, the term form the receipt of order to the delivery can be shortened.

[Embodiment 2]

Figure 24:
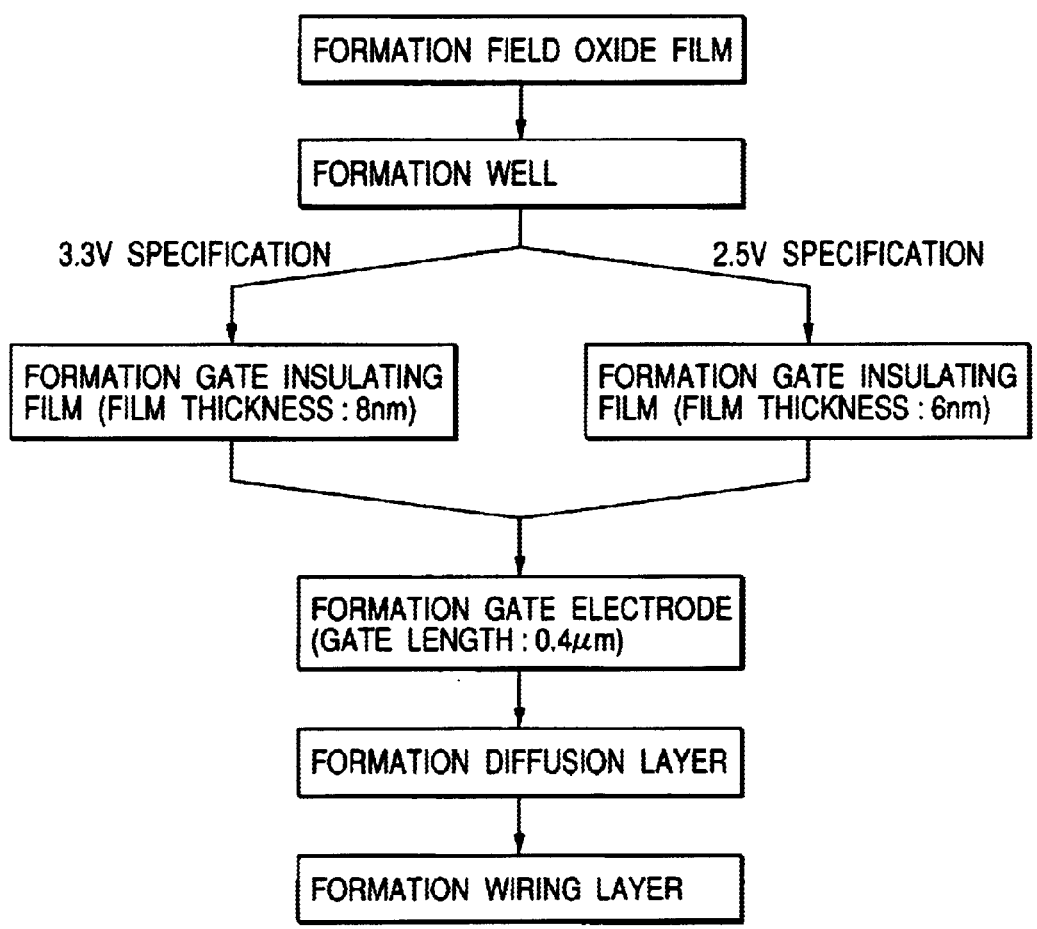
FIG. 24 is a flow chart illustrating a process of manufacturing the SRAM as another embodiment of the invention.

In the foregoing embodiment 1, the gate insulating film thickness (TOX) and the gate length (Lg) of the 3.3 V withstanding MOS transistor are specified as 8 nm and 0.4 μm, respectively; and the gate insulating film thickness (TOX) and the gate length (Lg) of the 2.5 V withstanding MOS transistor are specified as 6 nm and 0.3 μm, respectively. However, as shown in FIG. 24, the gate insulating film thickness (TOX) of the 3.3 V withstanding MOS transistor may be specified as 8 nm, the gate insulating film thickness (TOX) of the 2.5 V withstanding MOS transistor as 6 nm, and the gate length (Lg) as 0.4 μm, as being common to both.

Figure 25:
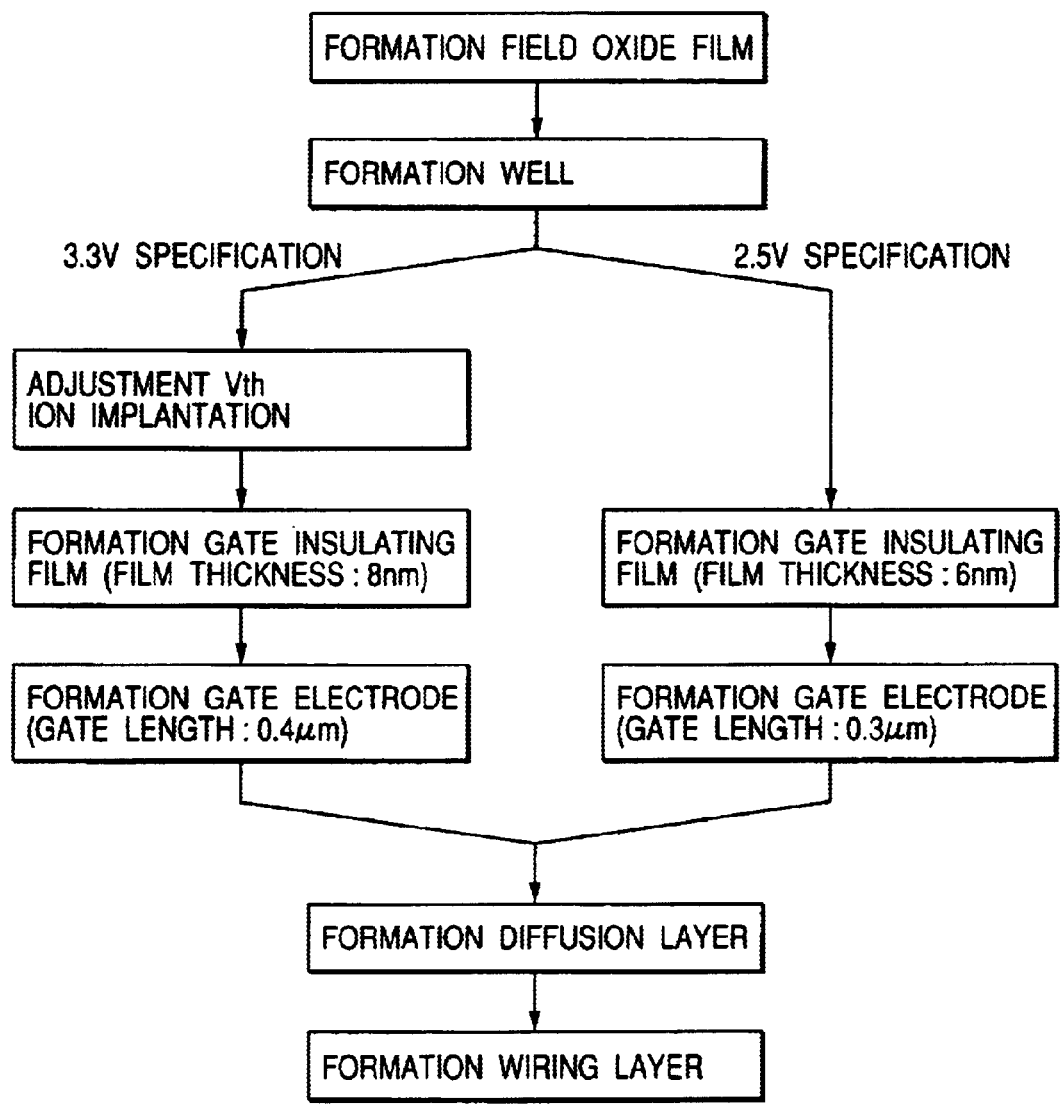
FIG. 25 is a flow chart illustrating a process of manufacturing the SRAM as another embodiment of the invention.
Figure 28:
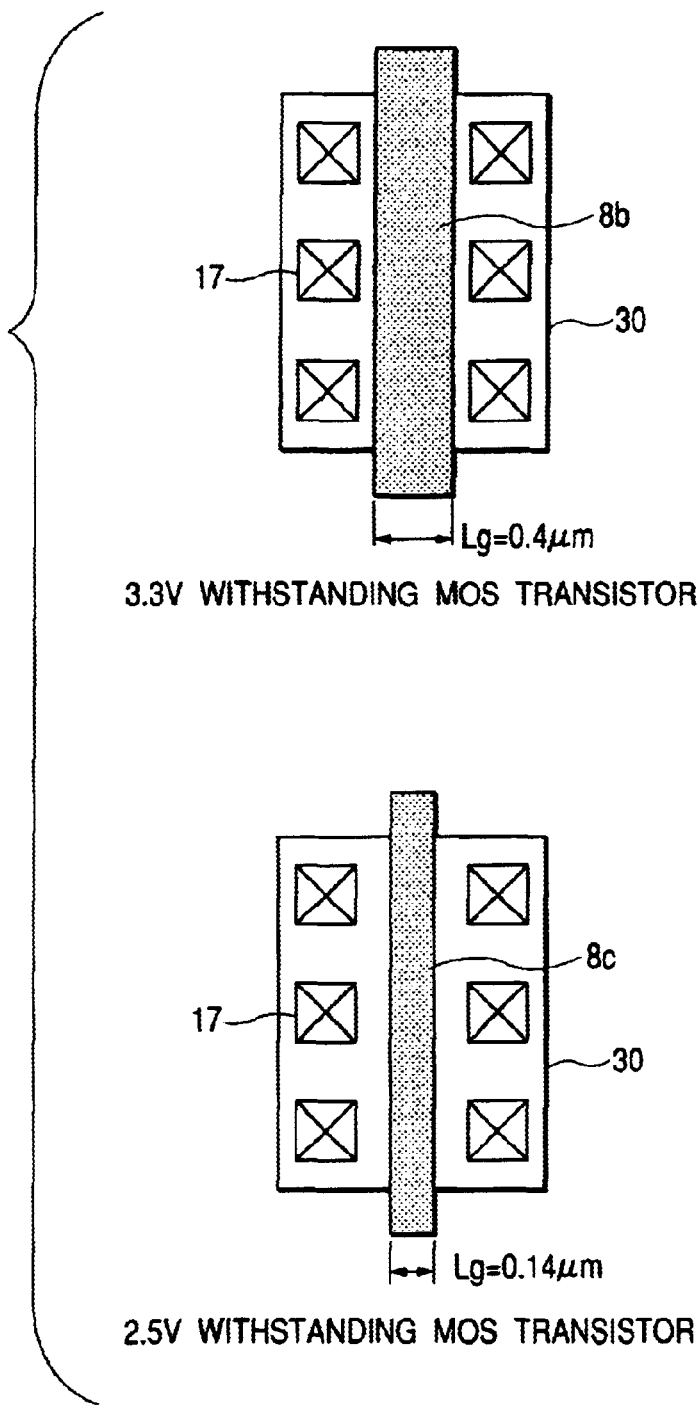
FIG. 28 is a plan view illustrating a MOS transistor of the SRAM as another embodiment of the invention.

Further, as shown in FIG. 25, the additional ion implantation may be conducted to the channel formed areas for the 3.3 V withstanding MOS transistor, so as to achieve a high-speed operation at the supply voltage 3.3 V, for further optimization.

Further, as shown in FIG. 26, the arrangements may be made in such a manner that the spacing (c) between the contact hole 17 of the 3.3 V withstanding MOS transistor and the edge of the active region 30 is made equal to the minimum processing dimension (a) of the spacing between the contact hole 17 and the gate electrode 8b, and the spacing (c') between the contact hole 17 of the 2.5 V withstanding MOS transistor and the edge of the active region 30 is made larger by α than the minimum processing dimension (a) of the spacing between the contact hole 17 and the gate electrode 8a. Here, α is equal to half the difference between the minimum processing gate length (Lg) of the 3.3 V withstanding MOS transistor and the minimum processing gate length (Lg) of the 2.5 V withstanding MOS transistor.

In case of the 2.5 V withstanding MOS transistor, the spacing between the contact hole 17 and the gate electrode 8a becomes equal to the minimum processing dimension (a), which restricts the decrease of currents by diffused resistors.

Further, as shown in FIG. 27, in a case that the lower I/O supply voltage (VDDQ) is equal to the internal supply voltage (VDDI), the input/output circuit of the 2.5 V specification can be configured with the 1.5 V withstanding MOS transistor, in the same manner as the internal circuit. In this case, all the MOS transistors in the SRAM of 2.5 V specification are made up with one kind of gate insulating film, which permits a further reduction of the manufacturing process.

The embodiments having been described concretely, it is natural that the invention is not limited to the above embodiments, and various modifications and changes will be possible without departing from the spirit and scope of the invention.

The above embodiments have related the SRAM conforming to two types of external supply voltage specifications as an example, however the invention can be applied in general to a semiconductor device having high-speed ICs conforming to plural external supply voltage specifications.

The invention exhibits the following effects as typical ones.

The invention achieves a high-speed performance of a semiconductor device conforming to plural supply voltage specifications.

The invention achieves a reduction of the manufacturing cost of a semiconductor device conforming to plural supply voltage specifications.

The invention achieves a shortening of the development term of a semiconductor device conforming to plural supply voltage specifications.

What is claimed is:

1. A semiconductor device including an input circuit or an output circuit configured with a plurality of first MOS transistors in a first area of a principal plane on a semiconductor substrate, and an internal circuit configured with a plurality of second MOS transistors in a second area of the principal plane on the semiconductor substrate, wherein a first voltage is applied to said plurality of first MOS transistor, wherein a second voltage is smaller than said first voltage is applied to said plurality of second MOS transistors, wherein a gate length of a first gate electrode of said plurality of first MOS transistors is larger than a gate length of a second gate electrode of said plurality of second MOS transistors, and wherein a spacing between said first gate electrode of the first MOS transistors and a first contact hole for connecting a wiring to a source region or a drain region of the first MOS transistor is larger then a spacing between said second gate electrode and a second contact hole for connecting a wiring to a source region or a drain region of the second MOS transistors.

2. A semiconductor device including an input circuit or an output circuit configured with a plurality of first MOS transistors in a first area of a principal plane on a semiconductor substrate, and an internal circuit configured with a plurality of second MOS transistors in a second area of the principal plane on the semiconductor substrate, wherein a first voltage is applied to said plurality of first MOS transistors, wherein a second voltage smaller than said first voltage is applied to said plurality of second MOS transistors, wherein a gate length of a first gate electrode of said plurality of first MOS transistors is larger than a gate length of a second gate electrode of said plurality of second MOS transistors, and wherein a spacing between an edge of a first active region in which the first MOS transistors are formed and a first contact hole for connecting a wiring to a source region or a drain region of the first MOS transistors is larger than a spacing between an edge of a second active region in which the second MOS transistors are formed and a second contact hole for connecting a wiring to a source region or a drain region of the second MOS transistors.

3. A semiconductor device according to claim 1, wherein said input circuit or said output circuit operates with said first voltage, and wherein said internal circuit operates with said second voltage.

4. A semiconductor device according to claim 1, wherein said plurality of first MOS transistors are first voltage withstanding MOS transistors, and wherein said plurality of second MOS transistors are second voltage withstanding MOS transistors.

5. A semiconductor device according to claim 1, wherein a gate insulating film thickness of the first MOS transistors is larger than a gate insulating film thickness of the second MOS transistors.

6. A semiconductor device according to claim 1, wherein an area of the active region in which the first MOS transistors are formed is larger than an area of the active region in which the second MOS transistors are formed.

7. A semiconductor device according to claim 1, wherein said plurality of first MOS transistors are p-channel type, and the source of each of said plurality of first MOS transistors is supplied with said first voltage, and wherein said plurality of second MOS transistors are p-channel type, and the source of each of said plurality of second MOS transistors is supplied with said second voltage.

8. A semiconductor device according to claim 2, wherein said input circuit or said output circuit operates with said first voltage, and wherein said internal circuit operates with said second voltage.

9. A semiconductor device according to claim 2, wherein said plurality of first MOS transistors are first voltage withstanding MOS transistors, and wherein said plurality of second transistors are second voltage withstanding MOS transistors.

10. A semiconductor device according to claim 2, wherein a gate insulating film thickness of the first MOS transistors is larger than a gate insulating film thickness of the second MOS transistors.

11. A semiconductor device according to claim 2.

wherein an area of the active region in which the first MOS transistors are formed is larger than an area of the active region in which the second MOS transistors are formed.

12. A semiconductor device according to claim 2, wherein said plurality of first MOS transistors are p-channel type, and the source of each of said plurality of first MOS transistors is supplied with said first voltage, and wherein said plurality of second MOS transistors are p-channel type, and the source of each of said plurality of second MOS transistors is supplied with said second voltage.

* * * * *